US010680615B1

(12) United States Patent
Schultz et al.

(10) Patent No.: US 10,680,615 B1
(45) Date of Patent: Jun. 9, 2020

(54) CIRCUIT FOR AND METHOD OF CONFIGURING AND PARTIALLY RECONFIGURING FUNCTION BLOCKS OF AN INTEGRATED CIRCUIT DEVICE

(71) Applicant: Xilinx, Inc., San Jose, CA (US)

(72) Inventors: David P. Schultz, Longmont, CO (US); Ian A. Swarbrick, Santa Clara, CA (US); Nagendra Donepudi, Santa Cruz, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/367,073

(22) Filed: Mar. 27, 2019

(51) Int. Cl.
*H03K 19/177* (2020.01)
*H03K 19/17728* (2020.01)
*H03K 19/17756* (2020.01)
*H03K 19/17736* (2020.01)
*H03K 19/1776* (2020.01)

(52) U.S. Cl.
CPC ... *H03K 19/17728* (2013.01); *H03K 19/1776* (2013.01); *H03K 19/17744* (2013.01); *H03K 19/17756* (2013.01)

(58) Field of Classification Search
CPC ....... H03K 19/17728; H03K 19/17744; H03K 19/17756; H03K 19/1776
See application file for complete search history.

(56) References Cited

U.S. PATENT DOCUMENTS

| | | | |
|---|---|---|---|
| 6,781,407 B2 | 8/2004 | Schultz | |
| 6,924,663 B2 * | 8/2005 | Masui | H03K 19/17772 326/38 |
| 7,185,309 B1 | 2/2007 | Kulkarni et al. | |
| 7,199,608 B1 | 4/2007 | Trimberger | |
| 7,218,137 B2 * | 5/2007 | Vadi | H03K 19/17732 326/38 |
| 7,281,093 B1 | 10/2007 | Kulkarni et al. | |
| 7,301,822 B1 | 11/2007 | Walstrum, Jr. et al. | |
| 7,454,658 B1 | 1/2008 | Baxter | |
| 7,328,335 B1 | 2/2008 | Sundararajan et al. | |
| 7,420,392 B2 * | 9/2008 | Schultz | G06F 15/7867 326/101 |
| 7,500,060 B1 | 3/2009 | Anderson | |
| 7,521,961 B1 | 4/2009 | Anderson et al. | |
| 7,574,680 B1 | 8/2009 | Kulkarni et al. | |

(Continued)

OTHER PUBLICATIONS

U.S. Appl. No. 16/041,473, filed Jul. 20, 2018, Swarbrick, Ian A. et al., San Jose CA USA.

(Continued)

*Primary Examiner* — Alexander H Taningco
*Assistant Examiner* — Kurtis R Bahr
(74) *Attorney, Agent, or Firm* — Patterson + Sheridan, LLP

(57) ABSTRACT

A circuit for configuring function blocks of an integrated circuit device is described. The circuit comprises a processing system; a peripheral interface bus coupled to the processing system; and a function block coupled to the peripheral interface bus, the function block having programming registers and a function block core; wherein the programming registers store data determining a functionality of the function block core and comprise programming control registers enabling a configuration of the function block core using the data. A method of configuring function blocks of an integrated circuit device is also described.

18 Claims, 14 Drawing Sheets

(56) References Cited

U.S. PATENT DOCUMENTS

| | | |
|---|---|---|
| 7,576,561 B1 | 8/2009 | Huang |
| 7,650,248 B1 | 1/2010 | Baxter |
| 7,653,820 B1 | 1/2010 | Trimberger |
| 7,689,726 B1 | 3/2010 | Sundararajan et al. |
| 7,788,625 B1 | 8/2010 | Donlin et al. |
| 7,831,801 B1 | 11/2010 | Anderson |
| 8,020,163 B2 | 7/2011 | Nollet et al. |
| 8,006,021 B1 | 8/2011 | Li et al. |
| 8,214,694 B1 | 7/2012 | Mckechnie et al. |
| 8,415,974 B1 * | 4/2013 | Lysaght ........... H03K 19/17756 326/39 |
| 9,152,794 B1 | 10/2015 | Sanders et al. |
| 9,165,143 B1 | 10/2015 | Sanders et al. |
| 9,230,112 B1 | 1/2016 | Peterson et al. |
| 9,323,876 B1 * | 4/2016 | Lysaght ................... G06F 8/65 |
| 9,336,010 B2 | 4/2016 | Kochar |
| 9,411,688 B1 | 8/2016 | Poolla et al. |
| 9,652,252 B1 | 5/2017 | Kochar et al. |
| 9,652,410 B1 | 5/2017 | Schelle et al. |
| 9,722,613 B1 | 8/2017 | Schultz |
| 10,243,882 B1 | 3/2019 | Swarbrick |
| 2004/0114609 A1 | 6/2004 | Swarbrick |
| 2004/0210695 A1 | 10/2004 | Weber |
| 2008/0320255 A1 | 12/2008 | Wingard et al. |
| 2008/0320268 A1 | 12/2008 | Wingard et al. |
| 2012/0036296 A1 | 2/2012 | Wingard et al. |
| 2016/0049941 A1 * | 2/2016 | How ............... H03K 19/17748 326/9 |
| 2017/0041571 A1 * | 2/2017 | Tyrrell ............... H04N 5/37455 |
| 2017/0140800 A1 | 5/2017 | Wingard et al. |
| 2018/0367147 A1 * | 12/2018 | Khor .................. H03K 19/1776 |

OTHER PUBLICATIONS

U.S. Appl. No. 15/588,321, filed May 5, 2017, Camarota, R., et al., San Jose CA USA.

ARM Limited, "AMBA 3 APB Protocol Specification," V1.0., Sep. 25, 2003 pp. 1-34, ARM Limited, Cambridge, United Kingdom.

ARM Limited, "AMBA 4 Axis-Stream Protocol Specifiation" v1.0. Mar. 3, 2010, pp. 1-42, ARM Limited, Cambridge, United Kingdom.

ARM Limited, AMBA AXI and ACE Protocol Specification, Jun. 16, 2003, pp. 1-306, ARM Limited, Cambridge, United Kingdom.

Dally, William J. et al., "Deadlock=Free Message Routing in Multiprocessor Interconnection Networks," IEEE Transactions on Computers, May 1987, pp. 547-553, vol. C-36, No. 5, IEEE, Piscataway, New Jersey, USA.

Glass, Christopher et al., "The Turn Model for Adaptive Routing," Journal of the Association for Computing machinery, Sep. 1994, pp. 874-902, vol. 41, No. 5, IEEE, Piscataway, New Jersey, USA.

Rantala, Ville et al., "Network on Chip Routing Algorithms," TUCS Techincal Report No. 779, Aug. 2006, pp. 1-38, Turku Centre for Computer Science, Turke, Finland.

U.S. Appl. No. 15/964,901, filed Apr. 27, 2018, Swarbrick, Ian A., San Jose, CA USA.

U.S. Appl. No. 15/990,506, filed May 25, 2018, Swarbrick, Ian A. et al. San Jose, CA USA.

Xilinx, Inc., "Zynq-7000 AP SoC-32 Bit DDR Access with ECC Tech Tip." 15 pages, printed on Aug. 10, 2018, http://www.wiki.xilinx.com/Zynq-7000+AP+Soc+-+32+Bit+DDR+Access+with+ECC+Tech+Tip, San Jose, CA USA.

U.S. Appl. No. 15/936,916, filed Mar. 27, 2018, Swarbrick, Ian A. et al. San Jose, CA USA.

* cited by examiner

CIRCUIT FOR AND METHOD OF CONFIGURING AND PARTIALLY RECONFIGURING FUNCTION BLOCKS OF AN INTEGRATED CIRCUIT DEVICE

TECHNICAL FIELD

Examples of the present disclosure generally relate to electronic circuits and, in particular, to a circuit for and method of configuring function blocks of an integrated circuit device.

BACKGROUND

Different types of integrated circuit devices may have programmable resources. While an application specific integrated circuit (ASIC) having programmable resources, other devices comprise dedicated programmable logic devices (PLDs). One type of PLD is the Complex Programmable Logic Device (CPLD). A CPLD includes two or more function blocks that are connected together and to input/output (I/O) resources by an interconnect switch matrix, and may include a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. For both of these types of programmable logic devices, the functionality of the device is controlled by configuration data bits of a configuration bitstream (or configuration data bits sent during a partial reconfiguration) provided to the device for that purpose.

Many PLDs enable reconfiguration and have used an infrastructure for control of independent reconfigurable elements that consists of "Global" control signals, i.e., signals which are broadcast from a central controller, along with local state elements which can mask the effect of these Global controls, often referred to as Global Signal Control (GSC) bits. The GSC bit infrastructure depends on software which can keep track of the state of every GSC bit on a device. This can be described as a "Global Snapshot" of GSC bit state. Any partial reconfiguration event in the system requires the software to have a Global Snapshot of device programming before and after, as well as knowledge of the state of all the GSC bits on the device. There can be tens of thousands of independent functional blocks and GSC bits on a large reconfigurable device. As a result, the software needed to generate the programming and control information is very large and memory/compute intensive. This type of software often requires hours to run on a powerful computer.

Therefore, there is a need for circuits for and methods of configuring and reconfiguring integrated circuit devices that overcome problems of conventional devices.

SUMMARY

A circuit for configuring function blocks of an integrated circuit device is described. The circuit comprises a processing system; a peripheral interface bus coupled to the processing system; and a function block coupled to the peripheral interface bus, the function block having programming registers and a function block core; wherein the programming registers store data determining a functionality of the function block core and comprise programming control registers enabling a configuration of the function block core using the data.

A method of configuring function blocks of an integrated circuit device is also described. The method comprises coupling a peripheral interface bus to a processing system; coupling a function block to the peripheral interface, providing programming registers and programming control registers in the function block; storing programming data in the programming registers, wherein in the programming data determines a functionality of a function block core of the function block; and storing control data in programming control registers of the function block, wherein the control data enables a configuration of the function block core with the programming data.

DETAILED DESCRIPTION

Figure 1:
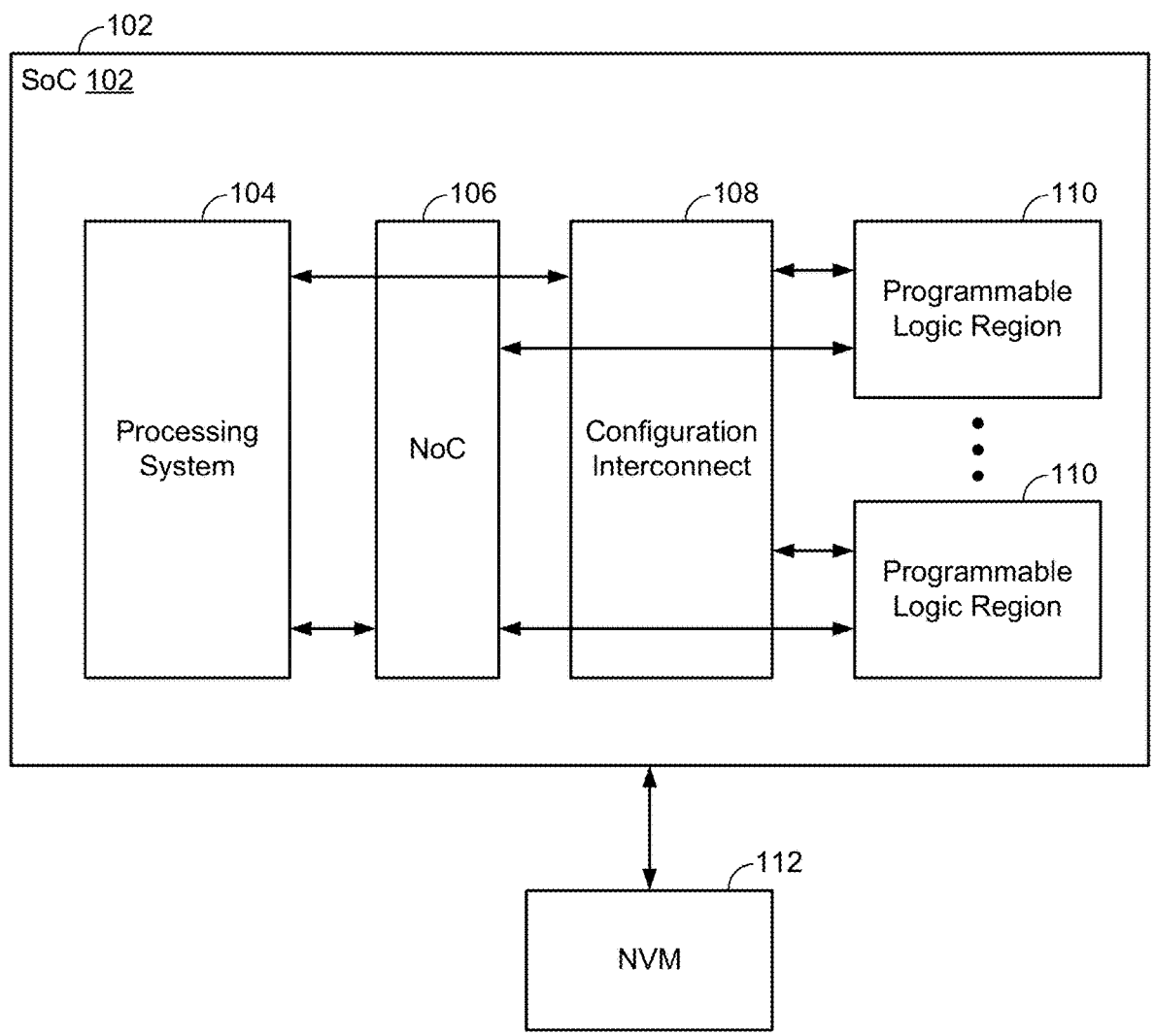
FIG. 1 is a block diagram depicting a system-on-chip (SoC) according to an example.

Advances in integrated circuit technology have made it possible to embed an entire system, such as including multiple processor cores, multiple memory controllers, and high-performance network-on-chip structures, in a single semiconductor chip. This type of chip is commonly referred to as a system-on-chip (SoC). Other SoCs can have different components embedded therein for different applications. Some, which include specialized compute elements, are referred to as Adaptive Compute Acceleration Platforms or ACAPs.

The SoC provides many advantages over traditional processor-based designs. It is an attractive alternative to multi-chip designs because the integration of components into a single device increases overall speed while decreasing size. The SoC is also an attractive alternative to fully customized chips, such as an application specific integrated circuit (ASIC), because ASIC designs tend to have a significantly longer development time and larger development costs. Programmable SoC devices (PSoCs), which include programmable logic, have been developed to obtain the benefits of both programmable logic and SoC. Now the flexibility of these systems has been improved by constructing many of the SoC components out of programmable SoC elements.

One model of reconfiguration control and programming involves a subset of device resources which can be independently programmed and controlled without knowledge of the state of the rest of the resources on the device. In this case the control mechanism is local to each independent functional block. A central controller individually addresses each block requiring control or programming. The programming can be generated by a small piece of software that can run in real time on an embedded processor, for example. This can be referred to as the "Driver" model of partial reconfiguration.

The circuits and methods for configuring function blocks of an integrated circuit device may use an addressable bus for applying control for configuration and partial reconfiguration (PR) of functional blocks which are found in programmable logic devices such as FPGA, Programmable SoC, or ACAP. Unlike fine-grained reconfigurable functions such as LUTs, configurable logic elements (CLEs), interconnect blocks, RAM elements, and the like, which may be better suited to a system of global control with local control masking, the circuits and methods may be well suited for large-grained reconfigurable functions such as high-speed serial transceivers, network-on-chip elements, and memory controllers, for example.

According to various implementations, multiple buses are used for configuring different parts of the integrated circuit device. For example, a distributed configuration memory array bus may be used for configuring fabric (e.g. CLBs, IOBs, and programmable routing resources), an APB or NPI bus may be used for configuring the NoC, XPIO, data transceivers, memory interfaces, for example, and the NoC itself may be used to configure a Math Engine array, for example. Each of these configuration targets may also have unique infrastructure used for control during configuration or partial reconfiguration. In the case of fabric, a Global Signal infrastructure could be used. In the case of NPI-configured blocks, a structure called a Programming Control and Status Register (PCSR) can be used. Each independent functional block that is configured via NPI has a dedicated PCSR—this enables its independence from a configuration and control standpoint. The PCSR has a collection of controls that perform similar functions internally to the NPI-configured blocks that the Global Signals do in configurable fabric. These functions include reset, clock enable, default configuration enable, calibration trigger, tristate (for external IO), as well as status that can be polled to check on device state.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

FIG. 1 is a block diagram depicting a system-on-chip (SoC) 102 according to an example. The SoC 102 is an integrated circuit (IC) comprising a processing system 104, a network-on-chip (NoC) 106, a configuration interconnect 108, and one or more programmable logic regions 110. The SoC 102 can be coupled to external circuits, such as a nonvolatile memory (NVM) 112. The NVM 112 can store data that can be loaded to the SoC 102 for configuring the SoC 102, such as configuring the NoC 106 and the programmable logic region(s) 110. In general, the processing system 104 is connected to the programmable logic region(s) 110 through the NoC 106 and through the configuration interconnect 108. Configuration can come from several different sources, such as PCIe, Ethernet, CAN, network storage, DDR, etc. The only part that will generally come from NVM is the initial boot image for the Platform Management Controller (PMC) and perhaps the configuration for a complex interface such as PCIe.

The processing system 104 can include one or more processor cores. For example, the processing system 104 can include a number of ARM-based embedded processor cores. The programmable logic region(s) 110 can include any number of configurable fabric block types, such as Configurable Logic Elements (CLEs), block RAMs (BRAM/URAM), digital signal processing blocks (DSP), etc, which may be programmed or configured using the processing system 104 through the configuration interconnect 108. The configuration interconnect 108 can enable, for example, frame-based programming of the fabric of the programmable logic region(s) 110 by a processor core of the processing system 104 (such as a platform management controller (PMC) described further below).

Figure 2:
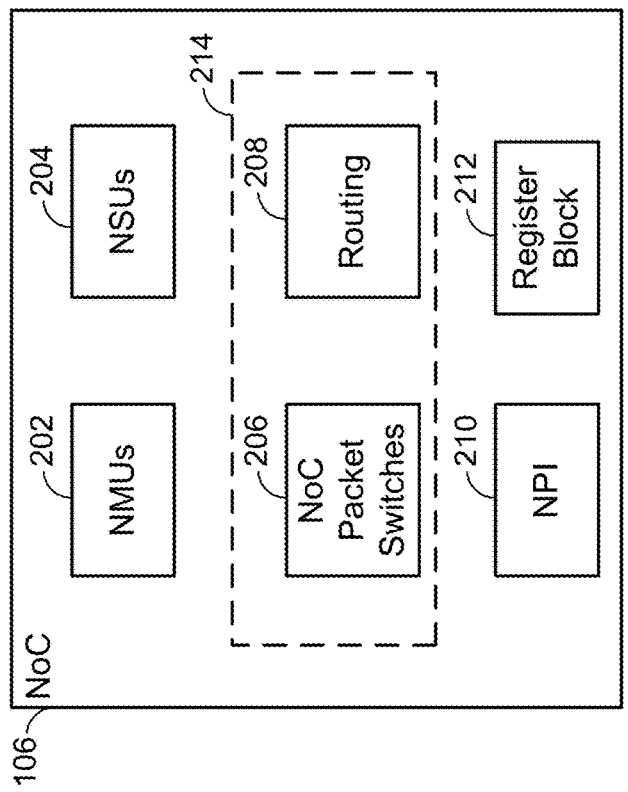
FIG. 2 is a block diagram depicting a network-on-chip (NoC) according to an example.

FIG. 2 is a block diagram depicting the NoC 106 according to an example. The NoC 106 includes NoC master units (NMUs) 202, NoC slave units (NSUs) 204, a network 214, NoC peripheral interconnect (NPI) 210, and register blocks 212. Each NMU 202 is an ingress circuit that connects a master circuit to the NoC 106. Each NSU 204 is an egress circuit that connects the NoC 106 to a slave endpoint circuit. The NMUs 202 are connected to the NSUs 204 through the network 214. In an example, the network 214 includes NoC packet switches 206 and routing 208 between the NoC packet switches 206. Each NoC packet switch 206 performs switching of NoC packets. The NoC packet switches 206 are connected to each other and to the NMUs 202 and NSUs 204 through the routing 208 to implement a plurality of physical channels. The NoC packet switches 206 also support multiple virtual channels per physical channel. The NPI 210 includes circuitry to program the NMUs 202, NSUs 204, and NoC packet switches 206. For example, the NMUs 202, NSUs 204, and NoC packet switches 206 can include register blocks 212 that determine functionality thereof. The NPI 210 includes a peripheral interconnect coupled to the register blocks 212 for programming thereof to set functionality. The register blocks 212 in the NoC 106 support interrupts, QoS, error handling and reporting, transaction control, power management, and address mapping control. The register blocks 212 can be initialized in a usable state before being reprogrammed, such as by writing to the register blocks 212 using write requests as described below. Configuration data for the NoC 106 can be stored in the NVM 112 (or any other configuration data source) and provided to the NPI 210 for programming the NoC 106 and/or other slave endpoint circuits.

Figure 3:
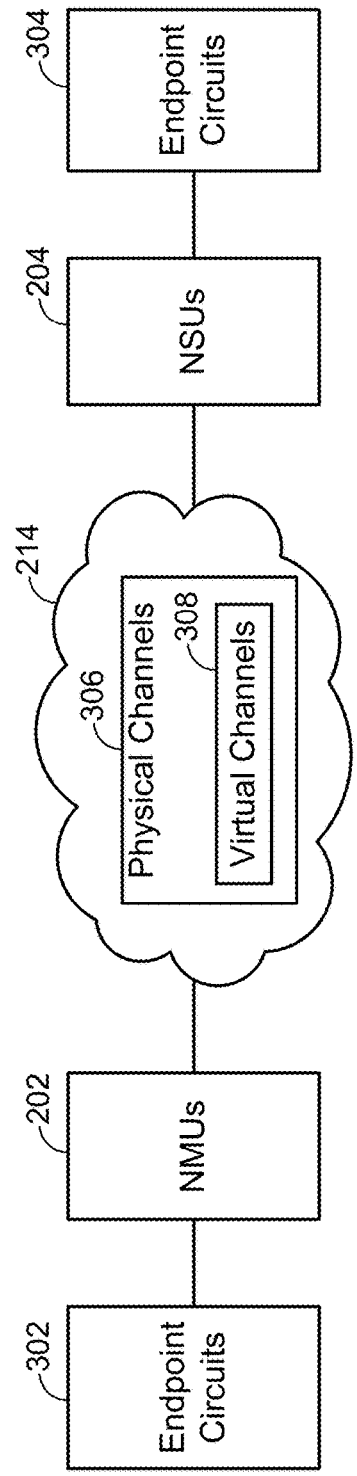
FIG. 3 is a block diagram depicting connections between endpoint circuits through the NoC according to an example.

FIG. 3 is a block diagram depicting connections between endpoint circuits through the NoC 106 according to an example. In the example, endpoint circuits 302 are connected to endpoint circuits 304 through the NoC 106. The endpoint circuits 302 are master circuits, which are coupled to NMUs 202 of the NoC 106. The endpoint circuits 304 are slave circuits coupled to the NSUs 204 of the NoC 106. Each endpoint circuit 302 and 304 can be a circuit in the processing system 104, a circuit in a programmable logic region 110, or a circuit in another subsystem. Each endpoint circuit in the programmable logic region 110 can be a dedicated circuit (e.g., a hardened circuit) or a circuit configured in programmable logic.

The network 214 includes a plurality of physical channels 306. The physical channels 306 are implemented by programming the NoC 106. Each physical channel 306 includes one or more NoC packet switches 206 and associated routing 208. An NMU 202 connects with an NSU 204 through at least one physical channel 306. A physical channel 306 can also have one or more virtual channels 308.

Figure 4:
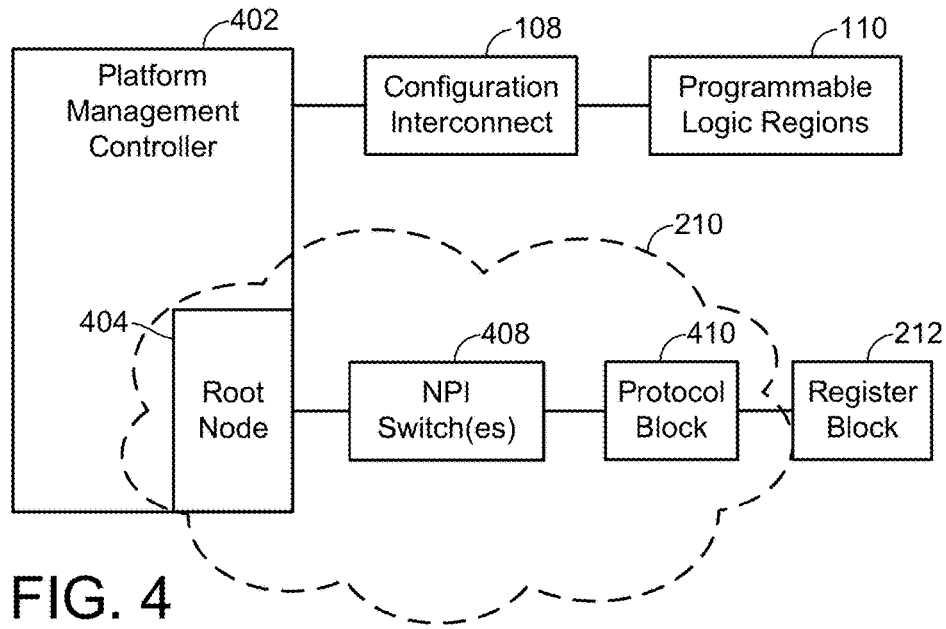
FIG. 4 is a block diagram depicting connections to a register block through a NoC Peripheral Interconnect (NPI) according to an example.

FIG. 4 is a block diagram depicting connections to a register block 212 through the NPI 210 according to an example. To connect to a register block 212, the NPI 210 includes a root node 404, one or more NPI switches 408, and a protocol block 410. The root node 404, in some examples, resides on a platform management controller (PMC) 402, which may further reside in the processing system 104, although in other examples, the root node 404 can be an independent circuit or reside on another system or circuit. The PMC 402 may control device configuration, security, power management, and debug operations for example. Generally, the root node 404 can packetize a transaction request into a format implemented by the NPI 210 and can transmit a memory mapped transaction request to an NPI switch 408, which can further transmit the memory mapped transaction request to other NPI switches 408 or to a protocol block 410. The protocol block 410 can then translate the memory mapped transaction request into a format implemented by the register block 212. The register block 212 is illustrated in FIG. 4 as an example of a slave endpoint circuit to which the NPI 210 can be connected. The NPI 210 can further be connected to other slave endpoint circuits, such as programmable components of a memory controller, temperature sensor, clock generator, etc. The NPI 210 is generally a tree topology as described by the example of FIG. 5.

The PMC 402 is further connected to the configuration interconnect 108, which is in turn connected to the programmable logic regions 110. The PMC 402 is configured to program the fabric of the programmable logic regions 110 through the configuration interconnect 108. The configuration interconnect 108 is a delivery mechanism for programming programmable units on the SoC 102 that is independent of the delivery mechanism of the NPI 210 for programming other programmable units (e.g., slave endpoint circuits) on the SoC 102.

Figure 5:
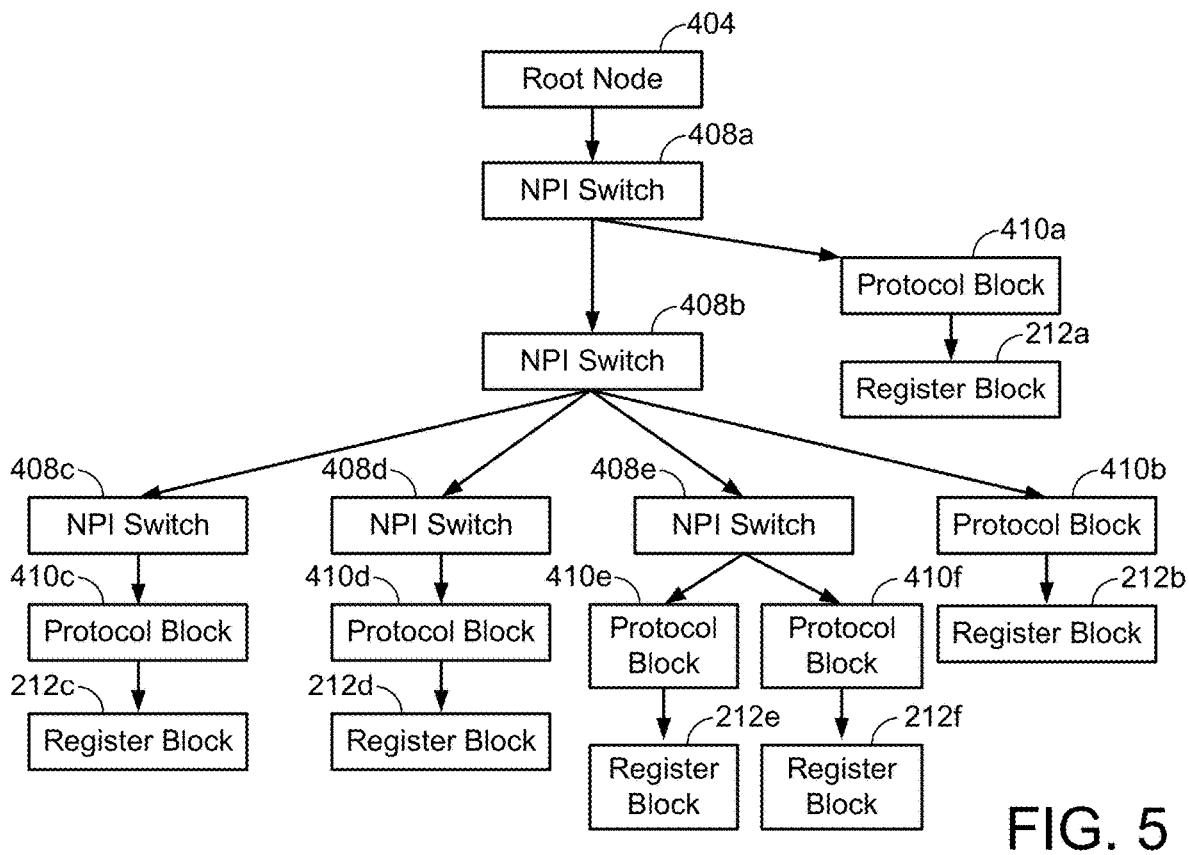
FIG. 5 is a simplified tree topology of the NPI according to an example.

FIG. 5 illustrates a simplified tree topology of the NPI 210 according to an example. Other configurations may be implemented in other examples. The root node 404 is the interface between one or more master circuits on the SoC 102 and the NPI 210. Ends of branches of the tree topology of the NPI 210 are connected to the slave endpoint circuits, such as the register blocks 212 in this example.

The root node 404 can implement an arbitration scheme, such as a round robin scheme, for handling transaction requests received from the one or more master circuits. The root node 404 can further translate between a protocol used by the one or more master circuits and a protocol used by the NPI 210. For example, the one or more master circuits can implement the Advanced eXtensible Interface fourth generation (AXI4) protocol, and the NPI 210 can implement an NPI Protocol. Hence, in such examples, the root node 404 can translate transaction requests and transaction responses between AXI4 and NPI Protocol.

The NPI switches 408 (individually illustrated as NPI switches 408a, 408b, etc.) include one input port and one or multiple (e.g., four) output ports. The respective input port of each NPI switch 408 is connected to an output port of a preceding node (e.g., root node 404 or NPI switch 408) in the tree topology. For example, the input port of the NPI switch 408a is connected to an output port of the root node 404; the input port of the NPI switch 408b is connected to an output port of the NPI switch 408a; the input port of the NPI switch 408c is connected to an output port of the NPI switch 408b; the input port of the NPI switch 408d is connected to an output port of the NPI switch 408b; and the input port of the NPI switch 408e is connected to an output port of the NPI switch 408b. As indicated, output ports of the NPI switches 408 can be connected to input ports of subsequent NPI switches 408 or to subsequent protocol blocks 410 in the tree topology. In the illustrated example, another output port of the NPI switch 408a is connected to an input port of the protocol block 410a; another output port of the NPI switch 408b is connected to an input port of the protocol block 410b; an output port of the NPI switch 408c is connected to an input port of the protocol block 410c; an output port of the NPI switch 408d is connected to an input port of the protocol block 410d; and respective output ports of the NPI switch 408e are connected to input ports of the protocol blocks 410e and 410f. Each output port of the NPI switches 408 can create a subsequent, or downstream, branch of the tree topology of the NPI 210.

As described in a more detailed example below, the upper NPI switch 408a in the tree topology receives transaction requests from the root node 404, and the upper NPI switch 408a and any subsequent NPI switch 408 (e.g., NPI switches 408b, 408c, etc.) direct the transaction requests to subsequent branches of the tree topology of the NPI 210 according to a destination identification of a slave endpoint circuit (e.g., register block 212) indicated in the respective transaction request.

The protocol blocks 410 have an input port connected to an output port of a preceding NPI switch 408, as described previously, and an output port connected to an input port of a subsequent register block 212. In the illustrated example, the output port of the protocol block 410a is connected to the input port of the register block 212a; the output port of the protocol block 410b is connected to the input port of the register block 212b; the output port of the protocol block 410c is connected to the input port of the register block 212c; the output port of the protocol block 410d is connected to the input port of the register block 212d; the output port of the protocol block 410e is connected to the input port of the register block 212e; and the output port of the protocol block 410f is connected to the input port of the register block 212f. The protocol blocks 410 can translate the transaction request from the protocol implemented on the NPI 210 to a protocol implemented by the respective slave endpoint circuit (e.g., register block 212). In some examples, the protocol blocks 410 can translate between NPI Protocol and the Advanced Microcontroller Bus Architecture (AMBA) 3 Advanced Peripheral Bus (APB3) protocol.

As indicated in an example below, the connections between various nodes may be described as between input and output ports; however, such connections can permit bi-directional communications. The description of various input ports and output ports are in the contexts of directionality of a transaction request from a master circuit to a slave endpoint circuit, and such designation as an input port or an output port is merely for convenience. As described below, a transaction response to a transaction request can be transmitted from an input port and received at an output port.

Figure 6:
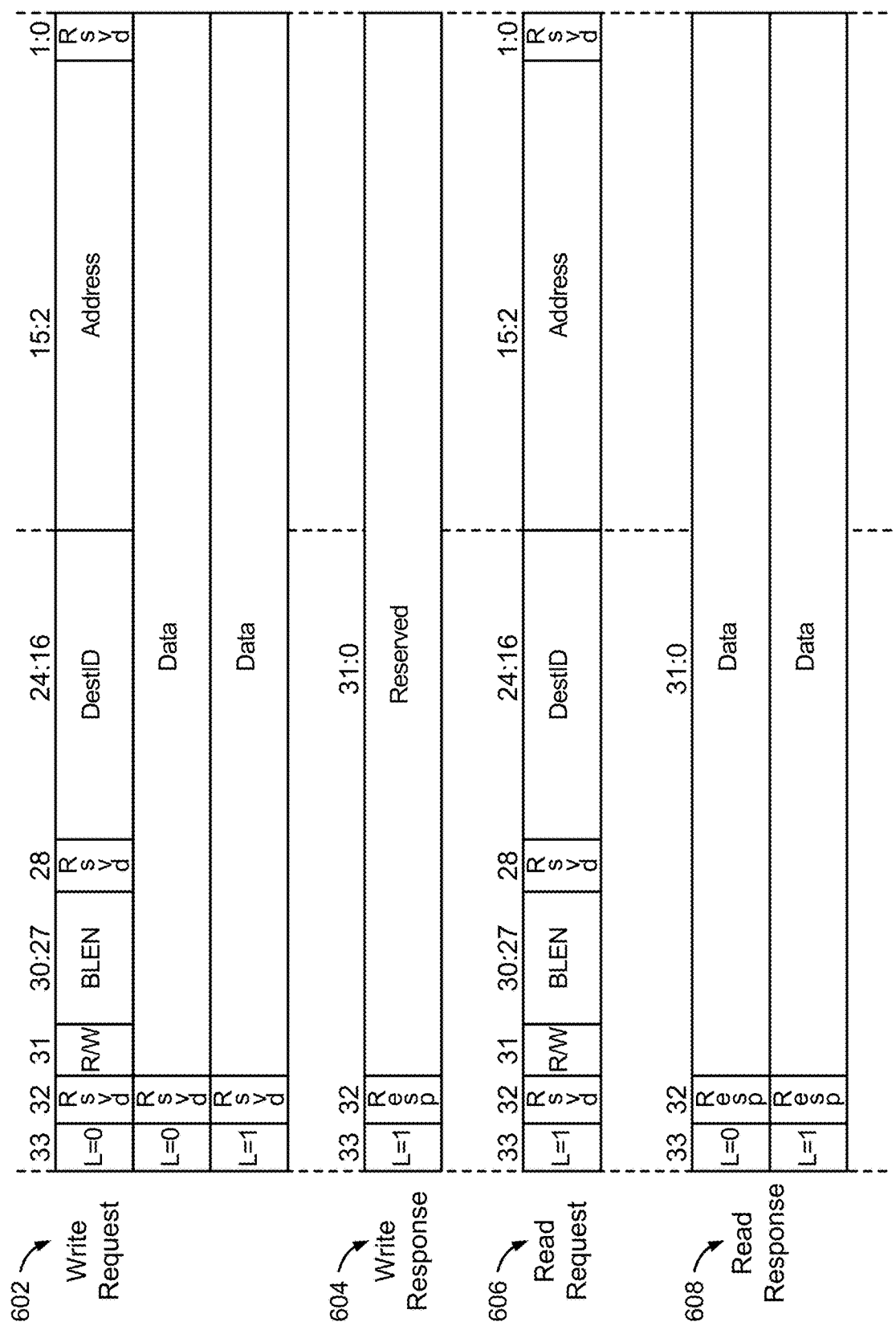
FIG. 6 shows example write and read request and response formats according to an example.

In some examples, the NPI Protocol is implemented by the NPI 210. FIG. 6 illustrates example transaction request and response formats of the NPI Protocol in some examples. FIG. 6 shows an NPI Protocol write request format 602, an NPI Protocol write response format 604, an NPI Protocol read request format 606, and an NPI Protocol read response format 608. In the illustrated examples, the transaction request and response formats implement a data flow-control digit (flit). A transaction request or response can include any number of data flits, where a last signal indication can indicate whether a subsequent data flit will follow the data flit containing the last signal indication, or the data flit containing the last signal indication is the last data flit of the transaction request or response. In the illustrated example, each of the formats 602, 604, 606, and 608 implement one or more data flits that are each thirty-four bits [33:0] in length, although other examples, any number of bits may be implemented in a data flit.

The NPI Protocol write request format 602 includes at least two data flits, and as illustrated, includes three data flits. The first data flit is a header data flit and is formatted as follows:
(1) Least significant two bits [1:0]—reserved or do not care
(2) Bits [15:2]—Destination Address
(3) Bits [24:16]—Slave Destination Identification (ID)
(4) Bit [28]—reserved or do not care
(5) Bits [30:27]—Burst Length (BLEN) of data flits containing data to be written
(6) Bit [31]—Read/Write Indication (Write)
(7) Bit [32]—reserved or do not care
(8) Most significant bit [33]—Last signal indication (0 for at least one subsequent data flit to follow)

The subsequent data flits are formatted as follows:
(1) Least significant thirty-two bits [31:0]—Data to be written
(2) Bit [32]—reserved or do not care
(3) Most significant bit [33]—Last signal indication (0 for at least one subsequent data flit to follow, or 1 for last data flit)

The NPI Protocol write response format 604 includes one data flit that is formatted as follows:
(1) Least significant thirty-two bits [31:0]—reserved or do not care
(2) Bit [32]—Response (1 for success, 0 for error)
(3) Most significant bit [33]—Last signal indication (1 for last data flit)

The NPI Protocol read request format 606 includes one data flit that is formatted as follows:
(1) Least significant two bits [1:0]—reserved or do not care
(2) Bits [15:2]—Destination Address
(3) Bits [24:16]—Slave Destination ID
(4) Bit [28]—reserved or do not care
(5) Bits [30:27]—Burst Length (BLEN) of data flits containing data to be written
(6) Bit [31]—Read/Write Indication (Read)
(7) Bit [32]—reserved or do not care
(8) Most significant bit [33]—Last signal indication (1 for last data flit)

The NPI Protocol read response format 608 includes one or more data flits, where each data flit is formatted as follows:
(1) Least significant thirty-two bits [31:0]—Data that is read
(2) Bit [32]—Response (1 for success, 0 for error)
(3) Most significant bit [33]—Last signal indication (0 for at least one subsequent data flit to follow, or 1 for last data flit)

Some example data flows are described in the context of the tree topology of FIG. 5 and the NPI Protocol transaction request and response formats of FIG. 6, according to some examples. The SoC 102 can include, for example, 512 slave endpoint circuits to and/or from which the NPI 210 can write and/or read, and hence, the NPI 210 can be connected to 512 register blocks 212 or other slave endpoint circuits. The 512 slave endpoint circuits (e.g., register blocks 212) is reflected in this example by the nine bits [24:16] of the NPI Protocol write request format 602 and the NPI Protocol read request format 606. Each register block 212 can include a configuration address space, such as 64 KB, that is addressable by the destination address, such as bits [15:2], of the NPI Protocol write request format 602 and the NPI Protocol read request format 606. The configuration address space can be contiguous or non-contiguous for any register block 212. Address space of multiple register blocks 212 can be grouped together. The slave endpoint circuits can be, for example, components of the NoC 106 (such as the NoC packet switches 206, NMUs 202, and NSUs) or other components in the SoC 102 (such as components in a memory controller, clock generator, temperature sensor, etc.).

Each NPI switch 408 can perform an auto-discovery scheme to identify which slave endpoint circuit is below or connected to which output port of the respective NPI switch 408, and the root node 404 has a mapping from upper address bits to a Destination ID of a slave endpoint circuit. The root node 404 is configured to translate an address of a slave endpoint circuit of a transaction request received from a master circuit into a Destination ID and a Destination Address by converting the upper bits of the address of the received transaction request into the Destination ID while maintaining the lower sixteen bits of the address of the received transaction request for the Destination Address. The root node 404 translates the received transaction request into an NPI Protocol transaction request that is in the NPI Protocol write request format 602 or the NPI Protocol read request format 606. The root node 404 then transmits the NPI Protocol transaction request to a first NPI switch 408 in the tree topology (e.g., NPI switch 408a). The first NPI switch 408 determines on which output port to transmit the NPI Protocol transaction request based on the Destination ID of the NPI Protocol transaction request. If the first NPI switch 408 determines that the slave endpoint circuit with the Destination ID is below, for example, the second output port and not the first output port of the first NPI switch 408, the first NPI switch 408 transmits the NPI Protocol transaction request on the second output port. Each subsequent NPI switch 408 that receives the NPI Protocol transaction request makes a similar determination based on the Destination ID of the NPI Protocol transaction request and transmits the NPI Protocol transaction request on the output port below which is the slave endpoint circuit designated by the Destination ID until the protocol block 410 corresponding to that slave endpoint circuit receives the NPI Protocol transaction request. The protocol block 410 then translates the NPI Protocol transaction request to the protocol implemented by the slave endpoint circuit and transmits the translated transaction request to the designated slave endpoint circuit.

Once the slave endpoint circuit has received the translated transaction request, the slave endpoint circuit transmits a transaction response back towards the root node 404. The protocol block 410 is configured to translate the transaction response of the slave endpoint circuit into an NPI Protocol transaction response that is in the NPI Protocol write response format 604 or the NPI Protocol read response format 608. The protocol block 410 then transmits the NPI Protocol transaction response to the NPI switch 408 to which the input port of the protocol block 410 is connected in the tree topology. Each NPI switch 408 that receives the NPI Protocol transaction response at an output port then transmits the NPI Protocol transaction response up the tree topology by transmitting the NPI Protocol transaction response through its input port. The NPI Protocol transaction response propagates up the tree topology to the root node 404, which translates the NPI Protocol transaction response to a translated response that is then transmitted to the appropriate master circuit.

The root node 404 is further configured to handle multiple transaction requests received from master circuits. If the root node 404 receives multiple transaction requests from master circuits simultaneously, the root node 404 implements an arbitration scheme, such as a round robin scheme, and serializes the transaction requests accordingly. If the root node 404 receives multiple transaction requests from master circuits simultaneously and/or over a short period, the root node 404 can serialize and buffer the transaction requests in a buffer, such as a first-in-first-out (FIFO) buffer. The root node 404 can translate the transaction requests in a serial manner and can subsequently transmit data flits in bursts, for example. A single data flit may be an NPI Protocol transaction request, or multiple data flits may compose an NPI Protocol transaction request, which may be transmitted in a burst. The root node 404 transmits the data flits in a pipelined manner to the first NPI switch 408 of the tree topology (e.g., NPI switch 408a).

The NPI switches 408 handle the first received NPI Protocol transaction request, with its n number of data flits, as described above. The NPI switches 408 will continue to propagate data flits (e.g., of the first and/or subsequent NPI Protocol transaction requests) following the first data flit of the first received NPI Protocol transaction request until: (i) an NPI switch 408 determines that a subsequently received NPI Protocol transaction request is to be transmitted on an output port of the NPI switch 408 on which the first received NPI Protocol transaction request was not transmitted, and (ii) that NPI switch 408 has not received an NPI Protocol transaction response from the slave endpoint circuit to which the first received NPI Protocol transaction request was transmitted. Stated differently, the NPI switches 408 do not transmit an NPI Protocol transaction request down a branch of the tree topology different from a branch where another previous NPI Protocol transaction request is currently pending. If an NPI switch 408 receives an NPI Protocol transaction request to be transmitted on an output port different from an output port where a previous NPI Protocol transaction request was transmitted and the NPI switch 408 has not received an NPI Protocol transaction response for the previous NPI Protocol transaction request, the NPI switch 408 blocks further propagation of any data flit from that NPI switch 408 and, in some examples, from upstream nodes, until an NPI Protocol transaction response to all respective previous NPI Protocol transaction requests have been received by the NPI switch 408. The NPI switch 408 can block propagation of any data flit received by the NPI switch 408 and, in some examples, any preceding NPI switch 408 and root node 404 in the tree topology. Once the appropriate NPI switch 408 receives an NPI Protocol transaction response for each previous NPI Protocol transaction request, the NPI switch 408 can terminate blocking propagation of any data flit, and propagation of data flits through the NPI switches 408 may resume.

To further illustrate the example, assume that a first master circuit transmits a write request for ninety-six bits of data at some address located in register block 212f, and that a second master transmits a read request for sixty-four bits of data at some address located in register block 212a. Further, assume that the root node 404 receives the write request one clock cycle before the root node 404 receives the read request, or that the root node 404 receives the write request and read request simultaneously and determines that the write request has priority over the read request according to the arbitration scheme. Hence, the root node 404 handles and serializes the write request before the read request.

The root node 404 translates the received write request according to the NPI Protocol write request format 602 to an NPI Protocol write request. The NPI Protocol write request is composed of four data flits, where (i) the first header data flit includes the Destination ID of the register block 212f, the Destination Address to be written, the burst length of three data flits (e.g., three write-data data flits), an indication of a write request, and an indication that the data flit is not the last signal; and (ii) the second through fourth data flits include data to be written with the second and third data flits having an indication that the respective data flit is not the last signal, and the fourth data flit having an indication that the data flit is the last signal. The root node 404 transmits the header data flit at a clock cycle and the three subsequent write-data data flits at respective subsequent clock cycles. The root node 404 places the received write request in a FIFO buffer pending a response to the NPI Protocol write request.

The root node 404 then translates the received read request according to the NPI Protocol read request format 606 to an NPI Protocol read request. The NPI Protocol read request is composed of one data flit including the Destination ID of the register block 212a, the Destination Address to be read, the burst length of two data flits (e.g., two read-data data flits), an indication of a read request, and an indication that the data flit is the last signal. The root node 404 transmits the data flit of the NPI Protocol read request at a clock cycle following the transmission of the last data flit of the NPI Protocol write request. The root node 404 places the received read request in the FIFO buffer pending a response to the NPI Protocol read request. Hence, the write request precedes the read request in the FIFO buffer.

Referring back to the NPI Protocol write request, the NPI switch 408a receives the header data flit at the first clock cycle. The NPI switch 408a determines from the header data flit that the Destination ID corresponds with a slave endpoint circuit below a first output port, and hence, the NPI switch 408a transmits the header data flit through the first output port to the NPI switch 408b at the next clock cycle. The NPI switch 408a continues to transmit data flits at respective clock cycles through the first output port until transmitting a data flit that includes an indication that that data flit is the last signal of the NPI Protocol write request. Similarly, the NPI switch 408b receives the header data flit at the second clock cycle. The NPI switch 408b determines from the header data flit that the Destination ID corresponds with a slave endpoint circuit below a third output port, and hence, the NPI switch 408b transmits the header data flit through the third output port to the NPI switch 408e at the next clock cycle. The NPI switch 408b continues to transmit data flits at respective clock cycles through the third output port until transmitting a data flit that includes an indication that that data flit is the last signal of the NPI Protocol write request. Further, the NPI switch 408e receives the header data flit at the third clock cycle. The NPI switch 408e determines from the header data flit that the Destination ID corresponds with a slave endpoint circuit below a second output port, and hence, the NPI switch 408e transmits the header data flit through the second output port to the protocol block 410f at the next clock cycle. The NPI switch 408e continues to transmit data flits at respective clock cycles through the second output port until transmitting a data flit that includes an indication that that data flit is the last signal of the NPI Protocol write request. After four clock cycles, the header data flit of the NPI Protocol write request has been received at the protocol block 410f (which then translates the NPI Protocol write request and forwards the translated write request to the register block 212f); the first write-data data flit has been received at the NPI switch 408e; the second write-data data flit has been received at the NPI switch 408b; and the third write-data data flit has been received at the NPI switch 408a.

The NPI switch 408a receives the data flit of the NPI Protocol read request at the fifth clock cycle, and the data flits of the NPI Protocol write request continue to propagate down the branch of NPI switches 408b, 408e. The NPI switch 408a determines from the data flit of the NPI Protocol read request that the Destination ID corresponds with a slave endpoint circuit below a second output port. However, the NPI switch 408a maintains, e.g., in a buffer, that an NPI Protocol transaction request—the NPI Protocol write request—has been transmitted through the first output port of the NPI switch 408a, and that the NPI switch 408a has not received an NPI Protocol transaction response to that NPI Protocol transaction request. Hence, the NPI switch 408a implements blocking of the propagation of data flits at the NPI switch 408a (e.g., the NPI switch 408a does not transmit the data flit of the NPI Protocol read request). The NPI switch 408a (and in some examples, any upstream NPI switches 408 and the root node 404) remains blocked until the NPI switch 408a receives an NPI Protocol write response to the NPI Protocol write request. During this blocked state, NPI switches 408 downstream of the NPI switch 408a, such as NPI switches 408b, 408e, can continue propagating data flits, unless a branching and corresponding blocking condition arises at a downstream NPI switch 408, for example.

After seven clock cycles, the four data flits have been transmitted to and received by the protocol block 410f, which translates the NPI Protocol write request into a format that is implemented by the register block 212f. The register block 212f thereafter processes the translated write request and transmits a write response to the translated write request to the protocol block 410f, which translates the write response according to the NPI Protocol write response format 604 to an NPI Protocol write response. The NPI Protocol write response is composed of one data flit including an indication whether the writing in the register block 212f was successful and an indication that the data flit is the last signal. The data flit of the NPI Protocol write response can then be transmitted back upstream through the NPI switches 408e, 408b, 408a to the root node 404, such as synchronously or asynchronously.

Upon receipt of the NPI Protocol write response at the NPI switch 408a, the NPI switch 408a terminates blocking transmission of data flits from the NPI switch 408a (and in some examples, any upstream NPI switch 408a and the root node 404). Hence, the NPI switch 408a transmits the data flit of the NPI Protocol read request through the second output port to the protocol block 410a at the next clock cycle. The protocol block 410a translates the NPI Protocol read request into a format that is implemented by the register block 212a. The register block 212a thereafter processes the translated read request and transmits a read response to the translated read request to the protocol block 410a, which translates the read response according to the NPI Protocol read response format 608 to an NPI Protocol read response. The NPI Protocol read response is composed of two data flits, with each including read data and an indication whether that the respective data flit is the last signal. The data flits of the NPI Protocol read response can then be transmitted back upstream through the NPI switch 408a to the root node 404, such as synchronously or asynchronously.

As a result of the serialization of NPI Protocol transaction requests by the root node 404 and the blocking by NPI switches 408 when branching occurs, NPI Protocol transaction responses to NPI Protocol transaction requests are received by the root node 404 in the order that the root node 404 transmits the NPI Protocol transaction requests to the NPI switches 408. Hence, the root node 404 is capable of maintaining a FIFO buffer of transaction requests received from master circuits and transmitting corresponding transaction responses to the master circuits for those transaction requests based on the order of the NPI Protocol transaction responses received by the root node 404. For example, in the above described example, the root node 404 transmits a transaction response to the first master circuit based on the received NPI Protocol write response before the root node 404 transmits a transaction response to the second master circuit based on the received NPI Protocol read response. Further, due to the serialization and possible blocking of transaction requests, the root node 404 may transmit responses to master circuits before transmitting the transaction requests to the tree topology, as described in further detail below.

In some examples, serial NPI Protocol transaction requests to a common slave endpoint circuit may not be blocked by NPI switches 408. In such a situation, the propagation of data flits of the NPI Protocol transaction requests do not create a branch situation at an NPI switch 408. The slave endpoint circuit may process and transmit a transaction response to each NPI Protocol transaction request sequentially received. In some examples, the last NPI switch 408 to the slave endpoint circuit may initiate blocking, such as to permit the slave endpoint circuit sufficient time to process the previous transaction request when the slave endpoint circuit does not include a buffer for the transaction requests.

A benefit of implementing an NPI as described in the foregoing examples includes optimizing write and sequential read requests. Suppose a master circuit transmits a write request to write data into a given address of a slave endpoint circuit. The master circuit may thereafter, such as in the immediately following clock cycle, transmit a read request to read the data from that given address of the slave endpoint circuit. The serialization of these two transactions by the root node 404, for example, permits the propagation of the subsequent read request through various NPI switches 408 before the root node 404 and master circuit receives a response to the write request. Hence, the read request can be propagated to some node or block in the NPI 210 before the write request is processed or completed.

Figure 7A:
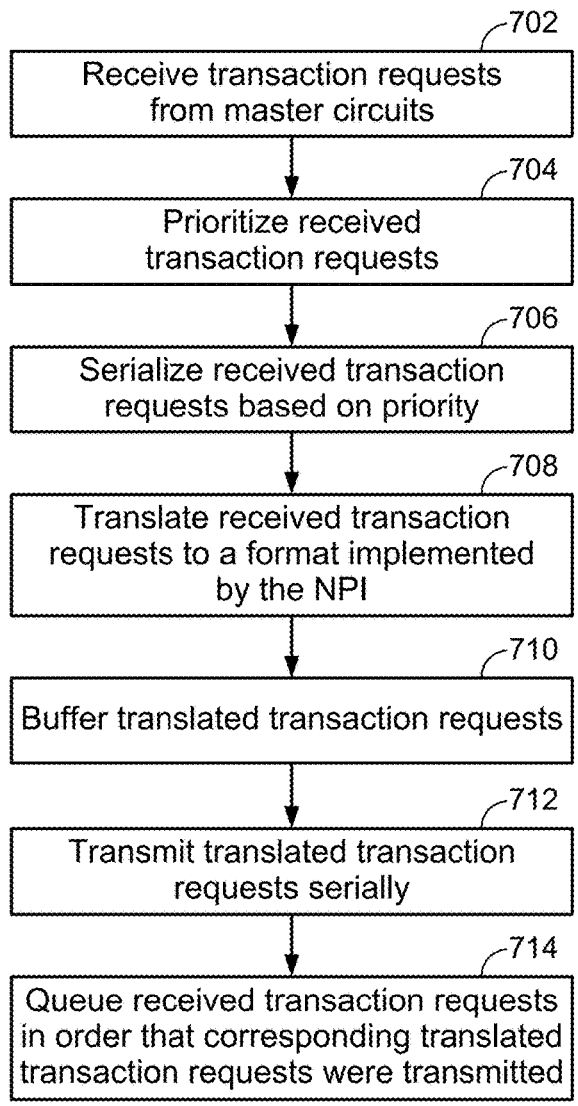
FIGS. 7A and 7B are flow charts of operations of a root node of an NPI according to some examples.
Figure 7B:
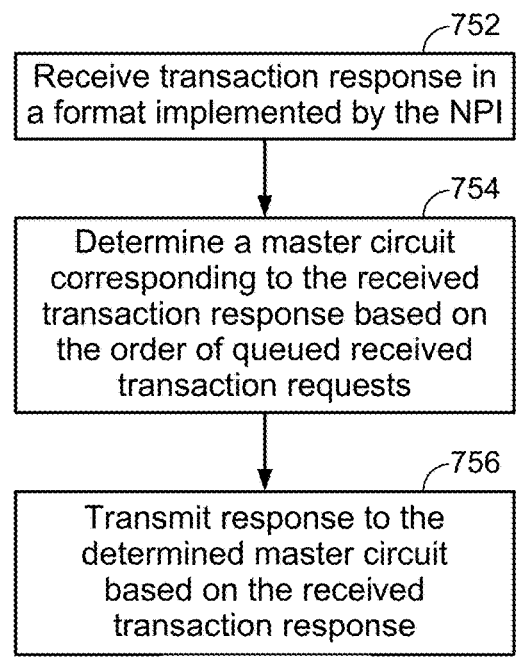

FIGS. 7A and 7B are flow charts of operations of the root node 404 according to some examples. FIG. 7A is a flow chart for handling a received transaction request by the root node 404, and FIG. 7B is a flow chart for handling a received transaction response by the root node 404.

Referring to FIG. 7A, in block 702, the root node 404 receives one or more transaction requests from one or more master circuits. In block 704, the root node 404 prioritizes the received transaction requests. For example, transaction requests that are received sequentially are prioritized in the order the transaction requests are received, and transaction requests that are received simultaneously (e.g., at a same clock cycle) undergo arbitration according to an arbitration scheme, such as a round robin arbitration scheme, implemented by the root node 404 to determine priority of the transaction requests received simultaneously. In block 706, the root node 404 serializes the received transaction requests according to the priority assigned to the respective transaction requests in block 704. In block 708, the root node 404 translates the received transaction requests to a format implemented by the NPI, such as the NPI Protocol write request format 602 and the NPI Protocol read request format 606 of FIG. 6.

In block 710, optionally, the root node 404 buffers the translated transaction requests, for example, in a FIFO buffer. The translated transaction request may be buffered in block 710 when the subsequent NPI switch 408 of the tree topology has de-asserted a ready to receive signal, as described subsequently. In block 712, the root node 404 transmits the translated transaction requests serially to the subsequent NPI switch 408 of the tree topology. The root node 404 transmits translated transaction requests, e.g., stored in the buffer first in the order that the translated transaction requests were stored (e.g., FIFO), and then, transmits subsequently translated transaction requests. Hence, the root node 404 transmits the translated transaction requests serially in the order that the received transaction requests were serialized in block 706. In addition to transmitting the translated transaction requests in a serialized order, the root node transmits one data flit per clock cycle, in some examples. A single data flit can compose a translated transaction request, and/or multiple consecutively transmitted data flits can compose a translated transaction request.

In block 714, the root node 404 queues the received transaction requests in the order that the respective corresponding translated transaction requests were transmitted to the subsequent NPI switch 408 of the tree topology. The queue can be implemented by pushing to a FIFO buffer, for example. The queue maintains received transaction requests that have been processed and transmitted by the root node 404 so the root node 404 can send transaction responses back to the corresponding master circuits when the root node 404 receives corresponding transaction responses. As described above, serialization and blocking of transaction requests through the tree topology can cause received responses to be in the order that the transaction requests were transmitted, and hence, a received transaction response can correspond to a head entry in a FIFO buffer.

The operations of the root node 404 illustrated in FIG. 7A assume that the subsequent NPI switch 408 of the tree topology has asserted a ready to receive signal. In some examples, the NPI switches 408 of the tree topology assert a ready to receive signal in a default state, and are capable of de-asserting the ready to receive signal under certain conditions, such as when the subsequent NPI switch 408 has insufficient storage space. As described above, if the subsequent NPI switch 408 of the tree topology de-asserts the ready to receive signal, the root node 404 may buffer translated transaction requests as shown in block 710 to thereby continue receiving and processing transaction requests in blocks 702-708.

Referring to FIG. 7B, in block 752, the root node 404 receives from the subsequent NPI switch 408 in the tree topology a transaction response in a format implemented by the NPI. In block 754, the root node 404 determines which master circuit corresponds to the received transaction response based on the order of the queued received transaction requests in block 714 of FIG. 7A. For example, the root node 404 can pop an entry from the FIFO buffer and determine which master circuit transmitted the transaction request to the root node 404 since ordering of the transaction requests and transaction responses can be maintained by serialization and blocking as described above. In block 756, the root node 404 transmits a transaction response to the determined master circuit based on the received transaction response. The root node 404 can create the transaction response to be in a format implemented by the determined master circuit.

In other examples, the root node 404 can transmit a response to a master circuit upon the transaction request received from the master circuit being serialized in block 706 of FIG. 7A. By merging transaction requests by the serialization, ordering of the transaction requests can be maintained. Hence, the root node 404 can respond to a master circuit before even transmitting the transaction request to the tree topology. This can avoid delay that could occur due to waiting, by a master circuit, for a response to a transaction request before transmitting another transaction request. For example, a master can send a write request to a location, the root node 404 can receive and serialize the write request, and the root node 404 can transmit a response to the master circuit before the root node 404 transmits the write request to the tree topology. Further, the master circuit, upon receiving the response from the root node 404, can transmit a read request of the same location, even if that read request is transmitted from the master circuit before the root node 404 transmits the write request to the location, since the serialization and blocking can ensure that the location is written appropriately before the location is subsequently read.

The order of operations in these flow charts are merely examples, and various operations can be implemented in different logical orders. A person having ordinary skill in the art will readily understand different orders of operations that may be implemented in other examples and any modifications to the flow charts of FIGS. 7A and 7B to implement those different orders. For example, the translation of block 708 may be implemented at any point before the transmission of the translated transaction request of block 712, and, for example, any of the prioritization of block 704, serialization of block 706, buffering of block 710, and queueing of block 714 may be performed on the received transaction request or the translated transaction request. Further, a person having ordinary skill in the art will understand that the operations of FIGS. 7A and 7B may be performed in parallel for different transaction requests and transaction responses, such as in pipelined processing. Various buffers may be implemented to accommodate pipelined or other processing, for example.

Figure 8A:
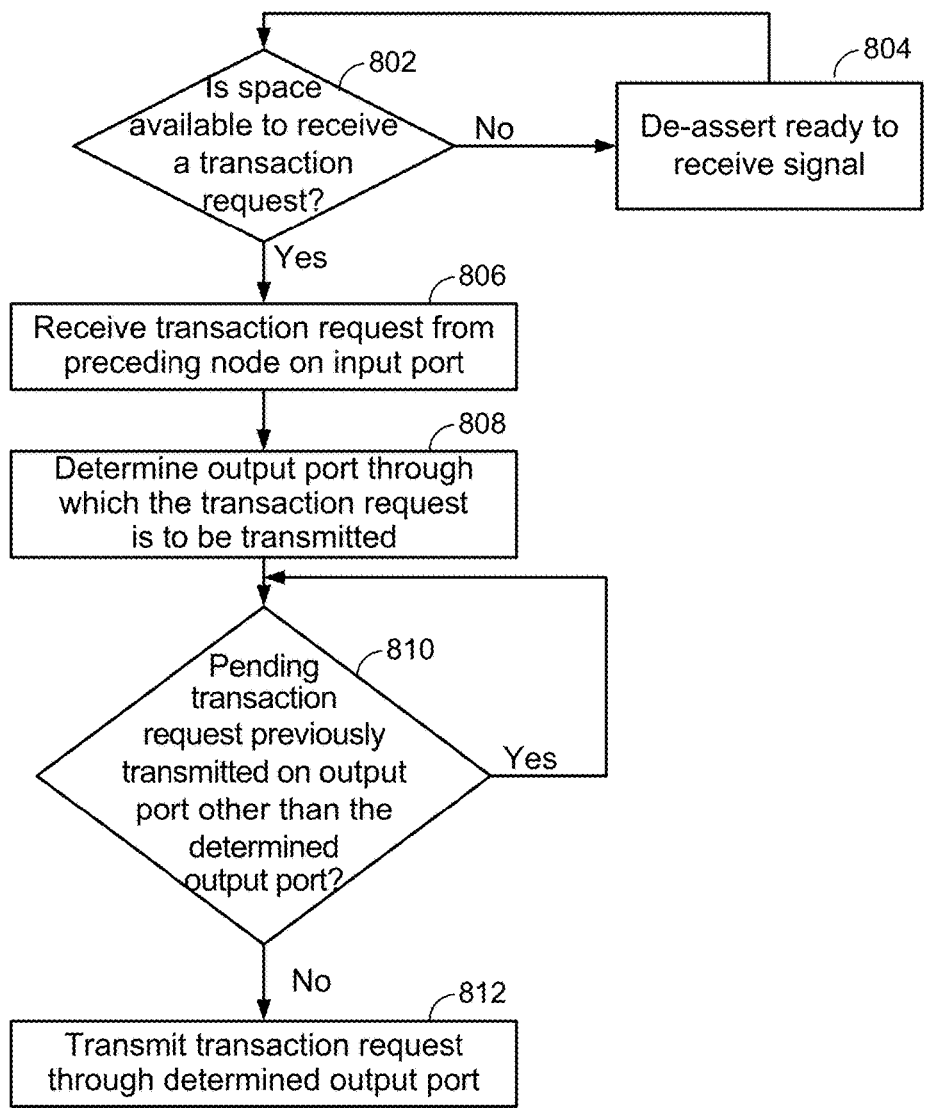
FIGS. 8A and 8B are flow charts of operations of an NPI switch of an NPI according to some examples.
Figure 8B:
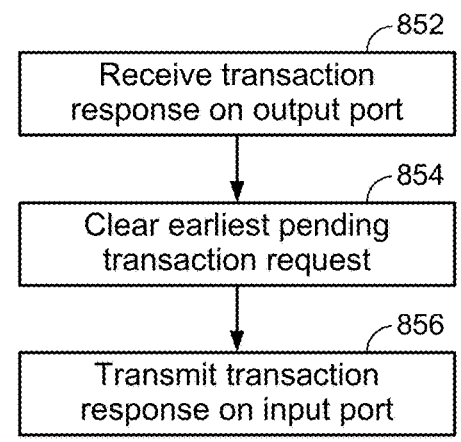

FIGS. 8A and 8B are flow charts of operations of an NPI switch 408 according to some examples. FIG. 8A is a flow chart for handling a received transaction request by an NPI switch 408, and FIG. 8B is a flow chart for handling a received transaction response by an NPI switch 408.

As described further below, each NPI switch 408 includes a 1-to-N buffer that can be implemented to receive and transmit transaction requests. Generally, one or more buffer, e.g., a FIFO buffer, can be implemented to store received transaction requests that are waiting processing and transmission. Further, one or more other buffer, e.g., a FIFO buffer, can be implemented to store transmitted transaction requests that are pending and awaiting a transaction response. The buffer(s) can be implemented to maintain serialization of the transaction requests.

Referring to FIG. 8A, in block 802, the NPI switch 408 determines whether space is available to receive a transaction request. The space available to receive the transaction request can be in a buffer, as stated above, to store a received transaction request as it waits processing and transmission. If space is available, a ready to receive signal is asserted, which may be a default state, as stated above with respect to FIG. 7A. If space is not available, the NPI switch 408 de-asserts the ready to receive signal, which prevents the immediately preceding node (e.g., an NPI switch 408 or root node 404) from transmitting a transaction request. Blocks 802 and 804 may loop until space becomes available to receive a transaction request, at which point, the ready to receive signal may be asserted if the signal was de-asserted.

In block 806, the NPI switch 408 receives a transaction request from an immediately preceding node (e.g., an NPI switch 408 or root node 404) in the tree topology on the input port of the NPI switch 408. Upon receipt, the NPI switch 408 may store the received transaction request in a FIFO buffer for processing and subsequent transmission. In block 808, the NPI switch 408 determines through which output port of the NPI switch 408 the transaction request is to be transmitted. The NPI switch 408 may determine the output port by identifying the output port based on a Destination ID of the slave endpoint circuit in the transaction request as previously described. In block 810, the NPI switch 408 determines whether a pending transaction request was previously transmitted on an output port other than the determined output port.

If no pending transaction request was previously transmitted on an output port other than the determined output port, in block 812, the NPI switch 408 transmits the transaction request through the determined output port to the immediately subsequent node (e.g., NPI switch 408 or protocol block 410), which may include transmitting multiple data flits of the transaction request at respective clock cycles until a data flit containing a last signal indication has been transmitted. Upon transmission, the NPI switch 408 may pop the received transaction request from the FIFO buffer in which it was stored and store (or push) the transmitted transaction request in another FIFO buffer. By popping the received transaction request from the FIFO buffer in which it was stored, space may become available in the FIFO buffer for subsequent receipt of another transaction request.

The stored transmitted transaction requests can indicate pending transaction requests that were previously transmitted for the determination in block 810. Referring back to block 810, the determination may refer to the Destination ID of any previously transmitted transaction requests that are stored. If there are no stored transmitted transaction requests, the determination of block 810 is negative, and the transaction request is transmitted in block 812. If there are stored transmitted transaction requests and the destination of any of the stored transmitted transaction requests (e.g., a first or last pending request) indicates that those requests were transmitted on an output port of the NPI switch 408 that is the same as the determined output port that is determined in block 806, the determination of block 810 is negative, and the transaction request is transmitted in block 812. If there are stored transmitted transaction requests and the destination of any of the stored transmitted transaction requests (e.g., a first or last pending request) indicates that those request were transmitted on an output port of the NPI switch 408 that is different from the determined output port that is determined in block 806, the determination of block 810 is positive, and the transaction request is not transmitted. In such a scenario, the determination of block 810 can continue to loop until the determination is negative. The clearing of pending transaction requests, which can cause the determination to become negative, is described in more detail with respect to FIG. 8B.

A positive determination at block 810 indicates a branching condition. By blocking transmission of a transaction request when a branching condition occurs by operation of the determination of block 810 and subsequent looping, serialization of transaction requests can be maintained, which in turn, can maintain proper serialization of transaction responses.

Referring to FIG. 8B, in block 852, the NPI switch 408 receives a transaction response on an output port. In block 854, the NPI switch 408 clears the earliest pending transaction request. For example, the NPI switch 408 can pop the stored transmitted transaction request in the FIFO buffer that is the earliest pending transmitted transaction request. By clearing a pending transmitted transaction request, a branching condition at the NPI switch 408 may be removed (e.g., by clearing a condition that results in a positive determination in block 810). In block 856, the NPI switch 408 transmits the transaction response to the immediately preceding node (e.g., NPI switch 408 or root node 404) on the input port of the NPI switch 408.

In the described example of FIGS. 8A and 8B, the NPI switch 408 may continue receiving transaction requests when a branching condition occurs as determined in block 810. The received transaction requests can be stored in the appropriate FIFO buffer until no space is available for storing received transaction requests in that FIFO buffer. During the branching condition, no transaction requests are transmitted, and hence, no received transaction requests are popped from the FIFO buffer that stores the received transaction requests. This can lead to the FIFO buffer becoming full and no space being available for storing received transaction requests. Once no space is available for storing received transaction requests, the ready to receive signal is de-asserted in block 804, and the NPI switch 408 does not receive further transaction requests from the preceding node. In this example, therefore, transaction requests may be propagated through the tree topology until reaching a branching condition in the tree topology and until available space for storing received transaction requests has become full. This can reduce delay by continuing propagating transaction requests as far as maintaining serialization can permit.

In other examples, once a branching condition occurs in the tree topology, a signal can be asserted or de-asserted that indicates to preceding nodes in the tree topology and to the root node 404 that the branching condition has occurred and to block any transmission of transaction requests in the tree topology.

The order of operations in these flow charts are merely examples, and various operations can be implemented in different logical orders. A person having ordinary skill in the art will readily understand different orders of operations that may be implemented in other examples and any modifications to the flow charts of FIGS. 8A and 8B to implement those different orders. Further, a person having ordinary skill in the art will understand that the operations of FIGS. 8A and 8B may be performed in parallel for different transaction requests and transaction responses, such as in pipelined processing. Various buffers may be implemented to accommodate pipelined or other processing, for example. For example, an NPI switch 408 can implement buffers to receive a transaction request in block 806 and transmit another transaction request in block 812 in a same clock cycle.

Figure 9:
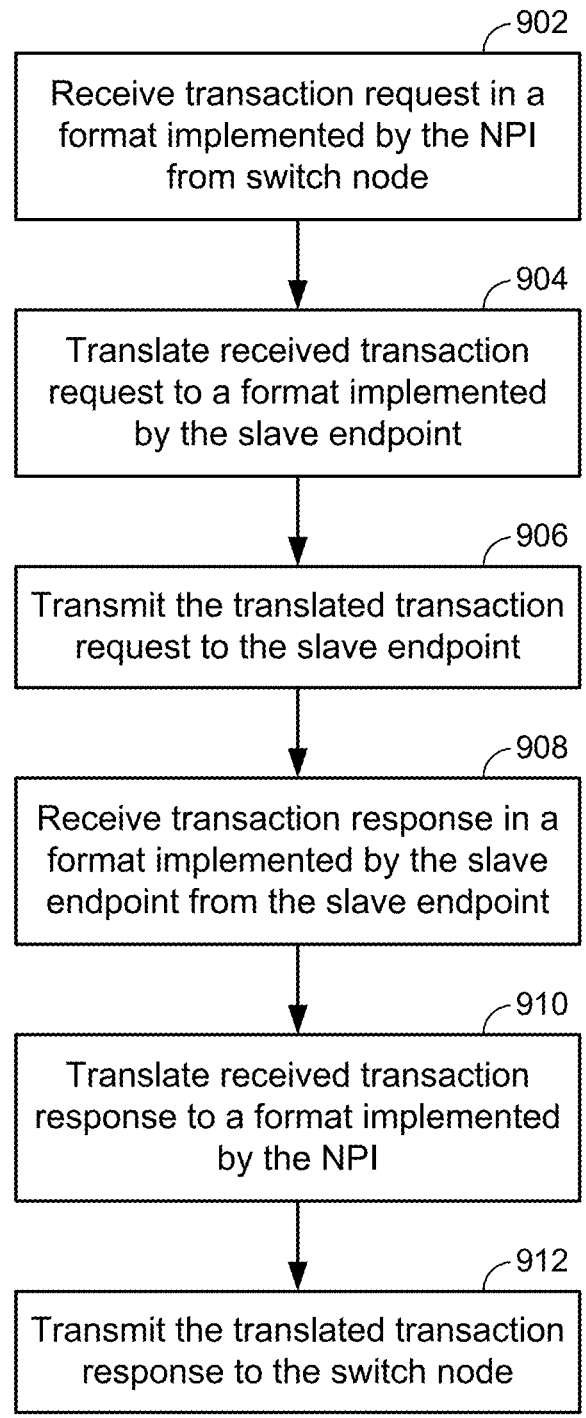
FIG. 9 is a flow chart of an operation of a protocol block of an NPI according to some examples.

FIG. 9 is a flow chart of an operation of a protocol block 410 according to some examples. In block 902, the protocol block 410 receives a transaction request in a format implemented by the NPI (e.g., the NPI Protocol write request format 602 and NPI Protocol read request format 606 of FIG. 6) from the preceding NPI switch 408 in the tree topology. In block 904, the protocol block 410 translates the received transaction request to a format implemented by the slave endpoint circuit (e.g., according to the APB3 protocol). In block 906, the protocol block 410 transmits the translated transaction request to the slave endpoint circuit. The translation and transmission of blocks 904 and 906, respectively, can be performed on a per data flit basis and/or per transaction request basis. For example, if a transaction request is three data flits, the protocol block 410 can implement a buffer for storing received data flits until the entire transaction request is received, and the protocol block 410 can then translate the entire transaction request.

In block 908, the protocol block 410 receives a transaction response in a format implemented by the slave endpoint circuit from the slave endpoint circuit. In block 910, the protocol block 410 translates the received transaction response to a format implemented by the NPI (e.g., the NPI Protocol write response format 604 and NPI Protocol read response format 608 of FIG. 6). In block 912, the protocol block 410 transmits the translated transaction response to the preceding NPI switch 408 in the tree topology. The protocol block 410 can transmit the translated transaction response to the preceding NPI switch 408 on a data flit per clock cycle basis, for example.

The order of operations in this flow chart is merely an example, and various operations can be implemented in different logical orders. A person having ordinary skill in the art will readily understand different orders of operations that may be implemented in other examples and any modifications to the flow chart of FIG. 9 to implement those different orders. Further, a person having ordinary skill in the art will understand that the operations of FIG. 9 may be performed in parallel for different transaction requests and transaction responses, such as in pipelined processing. Various buffers may be implemented to accommodate pipelined or other processing, for example.

Figure 10:
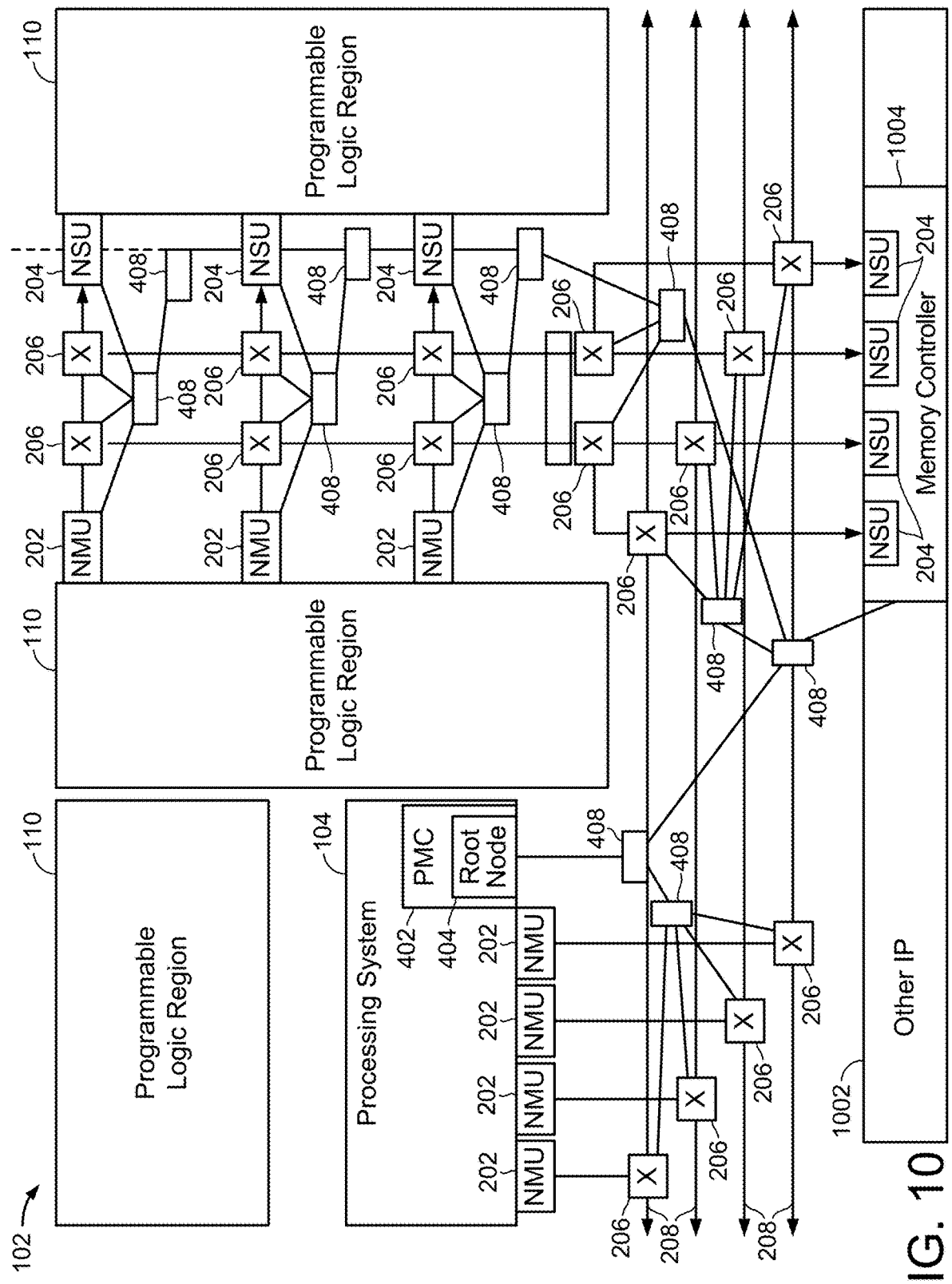
FIG. 10 is a simplified schematic of at least a portion of the SoC according to some examples.

FIG. 10 is a simplified schematic of at least a portion of the SoC 102 according to some examples. The illustrated SoC 102 includes an NoC 106 interconnected between the processing system 104, programmable logic regions 110, and other IP 1002 (such as a memory controller 1004), for example. The NoC 106 includes NMUs 202 connected to NSUs 204 through interconnected NoC packet switches 206 and routing 208, which interconnected NoC packet switches 206 and routing 208 form the network 214 having the physical channels 306 and virtual channels 308, for example. The NoC 106 further includes the NPI 210, which includes the root node 404 (that resides on the PMC 402 in the processing system 104), the NPI switches 408 in a tree topology, and protocol blocks 410 connected to slave endpoint circuits. The protocol blocks 410 are not specifically illustrated for simplicity, but may be in the tree topology disposed preceding respective slave endpoint circuits. The slave endpoint circuits, for example, include register blocks 212 of the NoC packet switches 206, NMUs 202, NSUs 204, memory controller 1004, and/or others.

Figure 11:
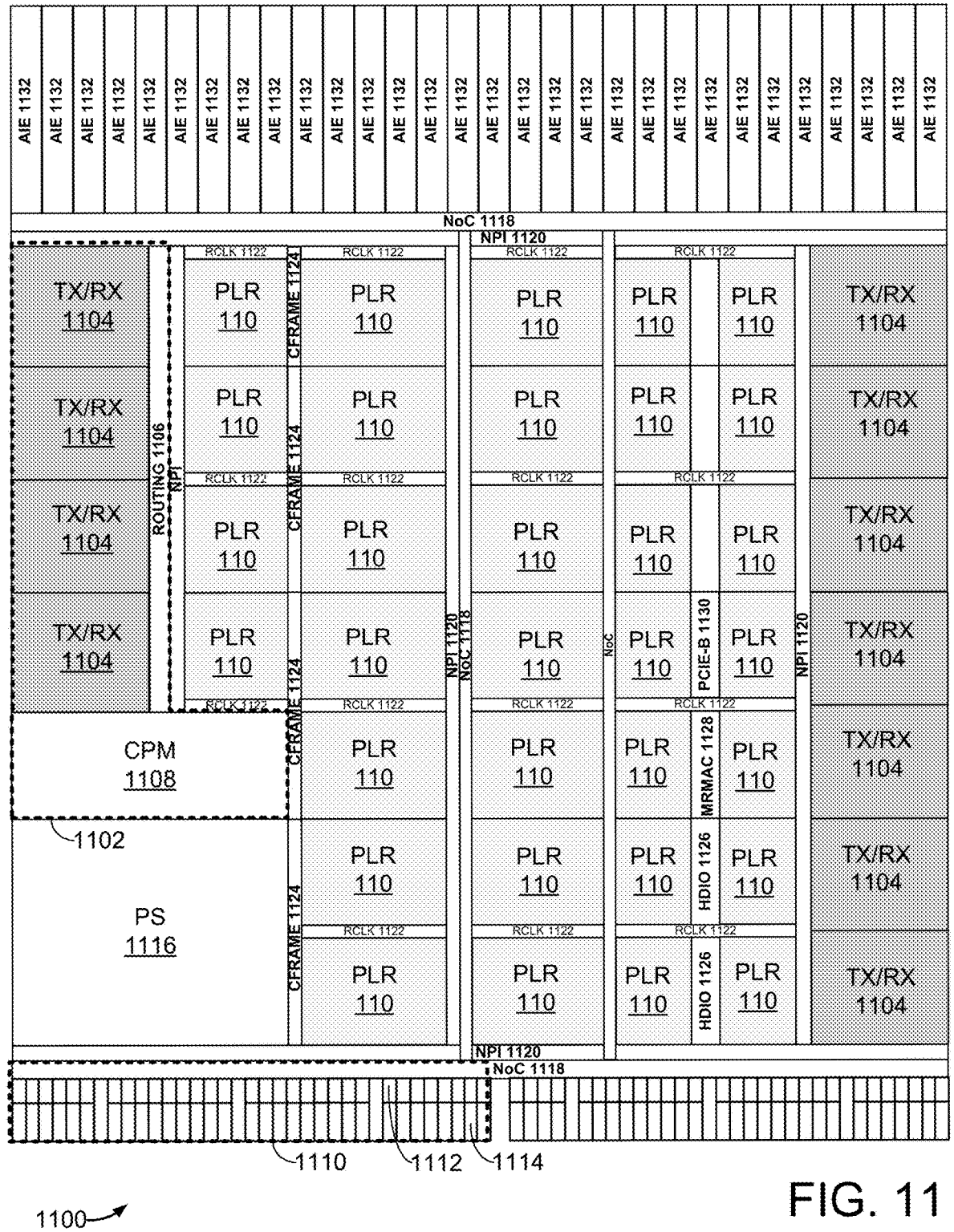
FIG. 11 is a block diagram of an integrated circuit providing local control for function blocks according to an example.

FIG. 11 is a block diagram of an integrated circuit providing local control for function blocks according to an example. The circuit 1100 of FIG. 11 comprises, in addition to the PLRs 110, a number of other function blocks (as will be described in more detail below), as well as other blocks enabling the configuration and operation of the function blocks. For example, the circuit 1100 may comprise a data interface subsystem 1102 having function blocks, such as transceiver (TX/RX) blocks 1104 and Routing blocks 1106. For a particular implementation where the data interface subsystem comprises a PCIe subsystem, the data interface subsystem may also include a CCIX PCIe Module (CPM) 1108. An example of an operation of a data interface subsystem, such as a Peripheral Component Interconnect Express (PCIe) subsystem, will be described in more detail in reference to FIG. 13. The circuit 1100 of FIG. 11 also comprises a memory interface subsystem 1110, which may include function blocks, such as for example physical interface blocks (PHY) blocks 1112 and input/output (IO) blocks 1114. An example of an operation of a memory interface subsystem will be described in more detail in reference to FIG. 12. A processor system (PS) 1116, which may be considered a subsystem of an SoC, may be implemented to enable the operation of the elements of the integrated circuit device. For example, the PS 1116 may include for example, an Application Processor (APU) core, a real-time processor (RPU) core, and a Processor-Subsystem Manager (PSM).

In addition to NoC 1118 and NPI 1120, which may be implemented generally as NoC 106 and NPI 210 as described above for example, other elements of the circuit 1100 are provided to enable the implementation of the circuit. For example, clock routing elements (RCLK) 1122 enable the routing of clock signals so that data, such as data associated with the data interface subsystem 1102 or the memory interface subsystem 1110, can be transmitted. Configuration frame circuitry (CFRAME) 1124 is provided to enable reading and writing CFI data frames. High Density IO (HDIO) 1126, Multi-Rate Media Access Control (MR-MAC) 1129, a PCIE-B block 1130, and other functional blocks can be embedded between the PLRs.

According to some implementation each sub-system may include of a collection of function blocks. While some elements of the circuit 1100, such as the PLRs 110, may be configured by way of a CFI bus and receive configuration control using global signals for example, other elements may be configured through an NPI bus and be controlled using PCSRs embedded in each programmable element configured through the NPI bus. Each defined sub-system that is configured through the NPI bus can be re-configured without any knowledge of the state of the rest of the integrated circuit device. For example, a data interface system comprising a PCIe sub-system may consist of Gigabyte Transceiver (GT) quads (i.e. 4-channels each), dedicated routing blocks which may have pipelining registers, the CPM, and NoC elements. According to some implementations, the CPM may include PCIe logic and direct memory access (DMA) circuits, for example. As will be described in more detail below in reference to FIG. 13, PCSRs may be used to provide individual configuration control of the elements of the subsystem. According to other implementations, the memory subsystem 1110 may be a double data rate (DDR) interface, for example, and include various 10 blocks, physical interfaces, a PLL, a DDR Memory Controller, and various NoC elements, as will be described in more detail in reference to FIG. 12. While it may be difficult to reconfigure these sub-systems in conventional PLDs without device-wide configuration information, the use of an NPI bus and PCSR infrastructure allows reconfiguration of these subsystems by a firmware driver only having information about resources associated with the subsystem.

According to some implementations, the NPI bus and configuration registers may enable 'burst register programming'. This burst register programming supports fast register-based configuration using a number of related mechanisms including for example: (1) the ability to send bursts all the way to the endpoint, even though the endpoint interface is not burst capable (i.e. transactions are chopped into individual register accesses) (2) the grouping of configuration specific registers to simplify writing to the registers using ordered memory access (OMA), and (3) the ability to turn on/off error reporting for accesses to unpopulated register addresses. Error reporting may be turned off for burst register programming and turned on again for proper error detection.

According to some implementations, device configuration may generally consist of the following stages: programming of registers in the NoC, GTs, memory controllers, etc., via the NPI bus; configuration of fabric blocks (CLE, INT, DSP, BRAM, etc.) through CFI; and startup sequence events (e.g. MMCM lock, DCI calibration, data transceiver calibration, Memory Controller calibration, and fabric startup) controlled through a combination of PCSR writes and Global Signal assertion/de-assertion sequences. The source of the firmware, NPI programming data, and PL frame data may be a flash storage device connected to the device, which may be an FPGA for example, through interface pins in the PMC. Other possible sources of configuration data may include PCIE, DRAM, JTAG, or fabric NoC ports for example.

Figure 12:
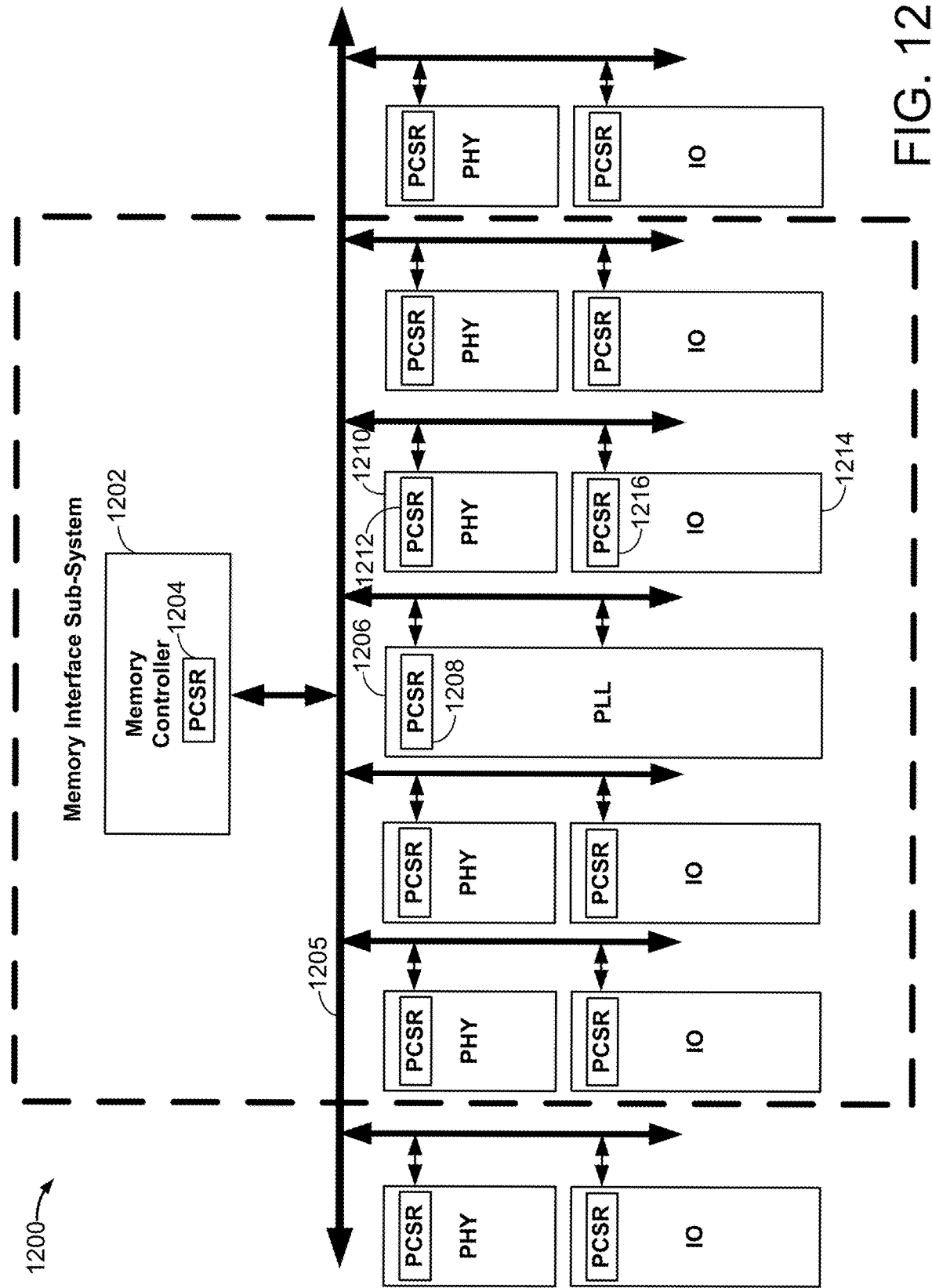
FIG. 12 is a block diagram of a portion of a circuit having a memory interface according to an example.

FIG. 12 is a block diagram of a portion of a circuit having a memory interface subsystem 1200 according to an example. The memory interface subsystem 1200 may implemented as the memory interface subsystem 1110 of FIG. 11. The memory interface subsystem 1200, which may be for example a double data rate (DDR) memory interface, may comprise a memory controller 1202 having a programming control register 1204, such as a PCSR. The memory controller 1202 is coupled to a peripheral interface bus 1205, which may be an NPI bus and implemented in NPI 210 or NPI 1120 as described above for example. A phase-locked loop (PLL) 1206 is a function block coupled to the NPI bus and comprises a programming control register 1208, such as a PCSR register as described above. The memory interface subsystem also comprises interface channels comprising a physical interface (PHY) block 1210 which is a function block having a programming control register 1212, such as a PCSR registers, and a corresponding 10 block 1214 which is a function block having a programming control register 1216, such as a PCSR register. According to the implementation of FIG. 12, 4 sets of PHY block and 10 block pairs are shown for the memory controller 1202. However, it should be understood that additional or fewer sets of PHY block and 10 block pairs could be associated with a memory controller, and that multiple memory interface subsystems could be implemented, such as for controlling the sets of PHY blocks and 10 blocks shown outside the dashed box having the sets of PHY blocks and 10 blocks associated with memory controller 1202. Using an NPI bus and PCSR infrastructure, it is possible to reconfigure the memory Interface Sub-System without knowing the state of any other device element, where each element of the sub-system can be individually controlled and programmed.

Figure 13:
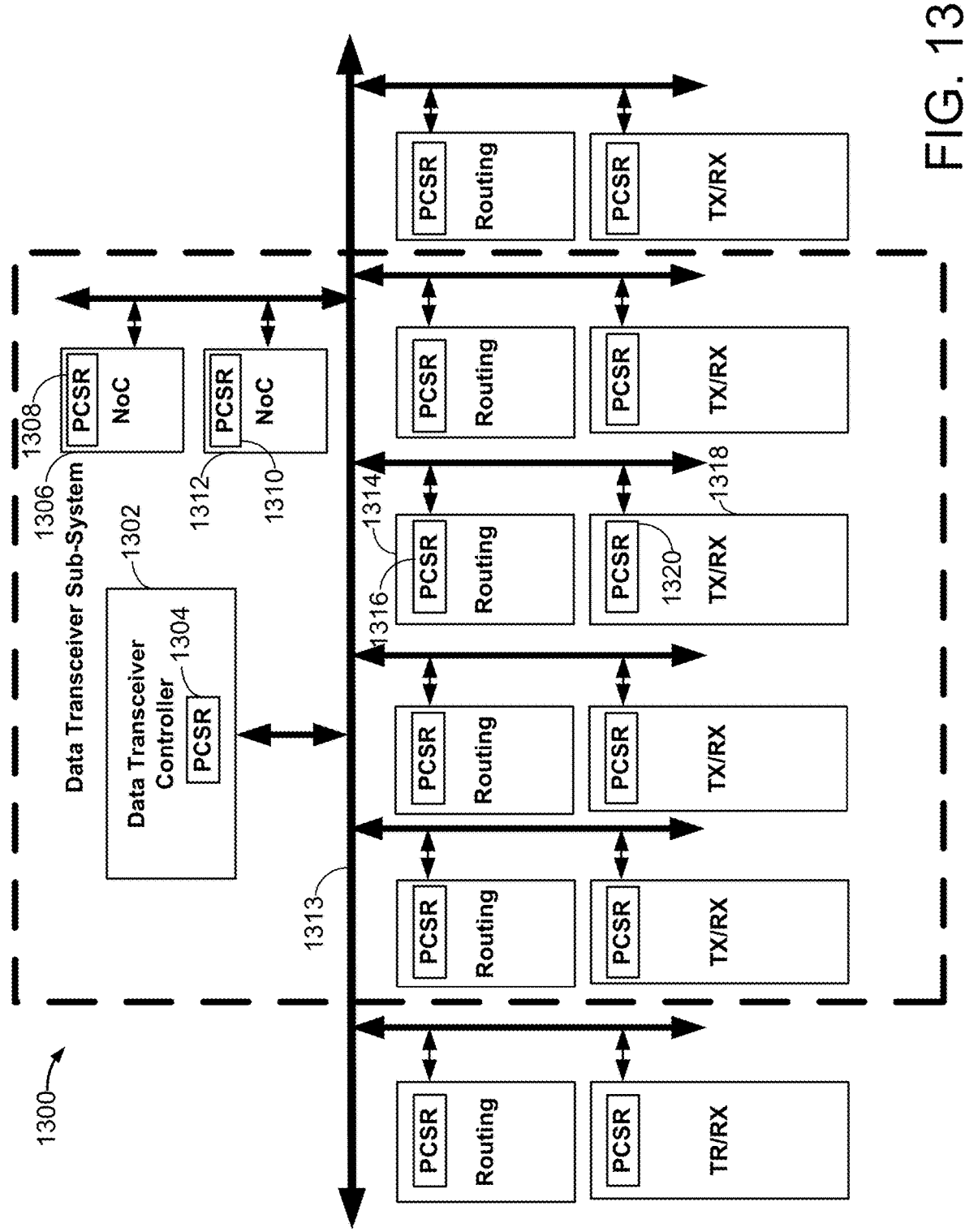
FIG. 13 is a block diagram of a portion of a circuit having a data transceiver interface according to an example.

FIG. 13 is a block diagram of a portion of a circuit having a data transceiver interface 1300 according to an example. The data transceiver interface 1300 of FIG. 13 comprises a data transceiver controller 1302 having a programming control register 1304, such as a PCSR register as described above. Each of a NOC 1306 (having programming control register 1308 such as a PCRS register) for the NMUs and a NOC 1310 (having programming control register 1312 such as a PCRS register) for the NSUs are coupled to peripheral interface bus 1313, such as an NPI bus as described above. The data transceiver interface 1300 also comprises routing blocks 1314 which are function blocks having a programming control register 1316 such as a PCSR register and corresponding data transceivers (TX/RX) 1318 which are function blocks having a 1320. The routing blocks may comprise dedicated routing blocks associated with a data transceiver as shown. That is, the routing blocks may be separate from general interconnect routing in the integrated circuit device and may be used specifically for routing signals in the data transceiver subsystem. While 4 sets of routing blocks 1314 and corresponding data transceiver 1318 are shown, it should be understood that additional or fewer sets of routing blocks and data transceivers could be associated with a data transceiver controller, and that multiple data transceiver subsystems could be implemented, such as for controlling the sets of routing blocks and data transceivers shown outside the dashed box having the sets of routing blocks and data transceivers associated with data transceiver controller 1302. Using the NPI and PCSR infrastructure, it is possible configure or reconfigure the Data Transceiver Sub-System without knowing the state of any other device element, where each element of the sub-system can be individually controlled and programmed.

Figure 14:
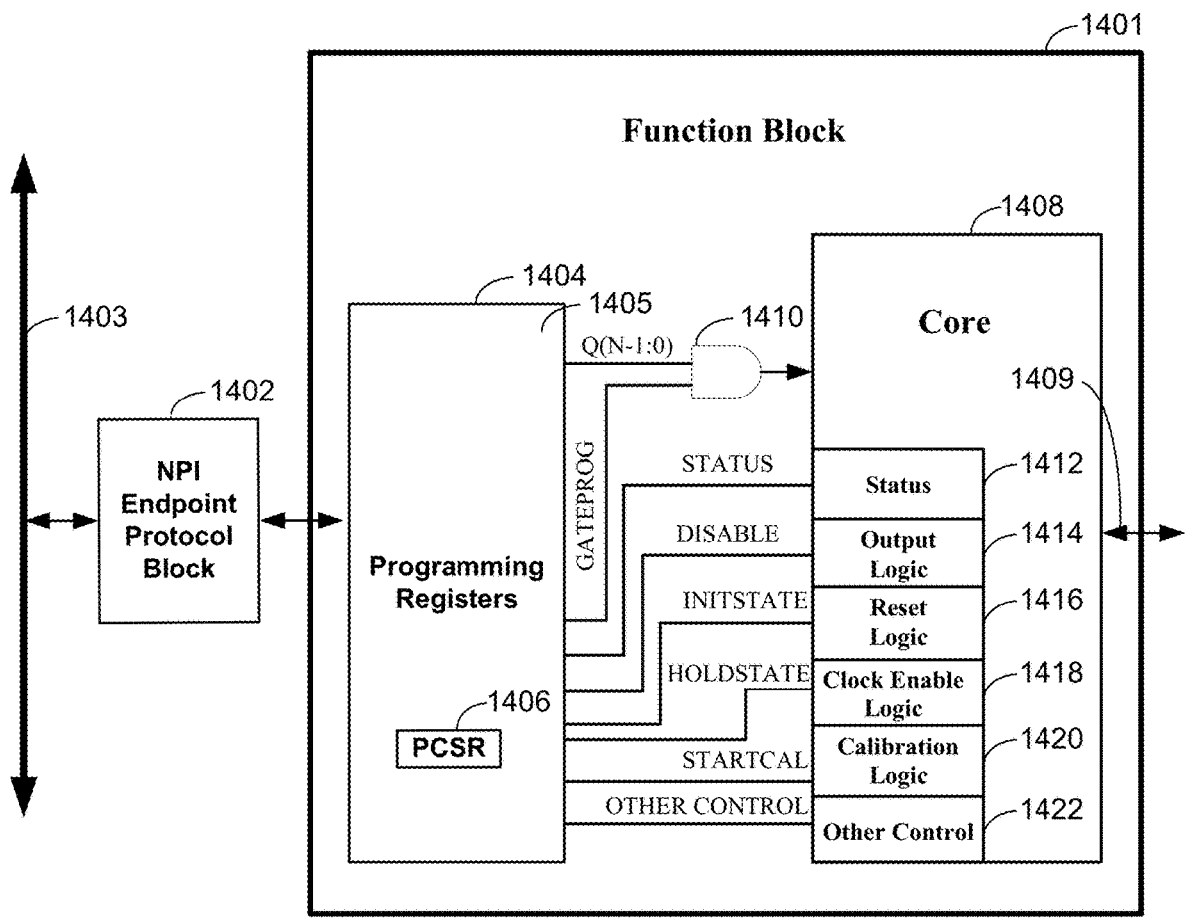
FIG. 14 is a block diagram of a circuit having a function block with a Programming Control and Status Register (PCSR) according to an example.

FIG. 14 is a block diagram of a portion of a circuit having a function block, such as the function blocks of FIGS. 12 and 13 according to an example. More particularly, an endpoint protocol block 1402, which may be implemented as described for the protocol blocks 410 as described above, is coupled to provide signals to the function block 1401. The function block 1401 comprises a programming register block 1404 having programming registers 1405 and a programming control register 1406, such as a PCSR. Data from the programming register block 1404 and control signals from the PCSR are provided by way of a peripheral interface bus 1403 to a function block core 1408 to enable operation of the function block. The function block communicates with other elements of the integrated circuit device by way of an interface 1409, depending upon the operation and function of the function block. Although the programming control register 1406 are shown as a part of the programming register block 1404, it should be understood that they could be a part of a separate register block.

According to one implementation, the function block receives programming data (also known as configuration data) from the NPI endpoint protocol block 1402, where the programming data may be stored in the programming registers of the programming register block 1404. Programming data (i.e. Q(N-1:0 of FIG. 14) is provided to a first input of an AND gate 1410 that may be configured to receive a gating signal (GATEPROG), which enables the gating of the programming data for the function block core 1408. The function block core 1408 comprises a number of control blocks adapted to receive control signals and to perform a control function associated with the function block core. For example, a status block 1412 may be configured to receive a status (STATUS) signal. That is, the PCSR may include certain status bits which can be polled by the PMC for example to determine the state of the function block. The status bits may provide information that can be used in the startup sequencing of a function block or for debug purposes. An output logic block 1414 is configured to receive a disable (ODISABLE) signal, which may be used to disable the function block core. For example, when a programming of a function block is being updated or when a scan is being performed, the output block should drive a constant, neutral value onto its output interface(s). Some blocks with multiple interfaces may require separate control depending on power sequencing or other considerations. For example, NoC NPS blocks may have 4 interfaces that are independent. A reset logic block 1416 is configured to receive an initial state (INITSTATE) signal. The initial state signal initializes a block state, where the block state may be programmable. A hold state (HOLDSTATE) may be provided to the clock enable logic 1418 and comprises a clock enable for a user visible state. A calibration trigger (STARTCAL) signal may be provided to calibration logic 1420 to enable a calibration function. Other functions such as test functions may be controlled by the PCSR controls, as set forth in Table 1, can be implanted in the Other Control block 1422 based upon other control signals that are not provided to one of the blocks 1412-1420. The control data of Table 1 is a standard group of controls that allowed standard firmware functions to be defined and used during configuration or partial reconfiguration.

TABLE 1

| Control Name | Bit Indexes | POR Reset Value | Reset for Control* | Description |
| --- | --- | --- | --- | --- |
| PCOMPLETE | 0 | 0 | POR | When asserted this bit indicates that the block is now in user operation mode. This bit is set by the PMC. |
| GATEREG | 1 | 1 | POR | Gates outputs of programming registers |
| ODISABLE[3:0] | 5:2 | 1111 | POR | Disables/Isolates block interfaces. Bit 2 should be used for a fabric interface. Bit 3 should be used for a 1$^{st}$ NoC interface, etc. |
| INITSTATE | 6 | 1 | SYS_RST | POR | Initializes block state (initialization state may be programmable). |
| HOLDSTATE | 7 | 1 | POR | Clock enable for user-visible state. |
| TRISTATE | 8 | 1 | SYS_RST | POR | Tristate control for external IO (i.e. pad drivers) |
| FABRICEN | 9 | 0 | POR | Controls isolation of fabric inputs. |
| STARTCAL | 10 | 0 | POR | Initiates a calibration operation. Self-clearing. |
| SCAN_CLEAR_TRIGGER | 11 | 0 | POR-only | Initiates a scan-clear operation. Scan-clear will not run if SCAN_CLEAR_DONE is asserted (See PSR) |
| APBEN | 12 | 0 | POR | Enable fabric APB port. This should be combined with the FABRICEN logic - i.e. APBEN is a don't-care if FABRICEN is 0. |
| DISNPICLK | 13 | 0 | POR | Disables NPI clock inside block. |
| PWRDN | 14 | 0 | POR-only | Power down control. |
| SYS_RST_MASK[2:0] | 17:15 | 000 | POR-only | System Reset Mask Bits |
| MEM_CLEAR_TRIGGER | 18 | 0 | POR-only | Triggers MBIST-clear in blocks with RAM MBIST such as DDRMC and GT |
| SLVERREN | 19 | 0 | POR-only | This is a test-only control which force an NPI Slave interface to return SLVERR on any access of an unpopulated register address |
| TEST_SAFE | 20 | 0 | POR-only | Latches all PCSR control outputs for test purposes. |
| Reserved | 23:21 | {3{1'b0}} | NA | Reserved |
| Extended PCSR | 31:24 | {8{1'b0}} | Depends on Control Function | Reserved for COE use |

The programming registers define the operation of programmable blocks such as routing blocks, data transceivers, physical interface blocks, and 10 blocks, for example, and may be reset when the power-on-reset (POR) signal for the function block is asserted.

One major difference between the use of Global Signals (associated with CFI configurations) and PCSRs (associated with NPI configurations) is that with Global Signals, the PR tools must identify all blocks which are "static" (e.g. not PR targets) and all blocks which are part of the Reconfigurable Module (RM), and set all the GSC bits accordingly. With the PCSR structure, the PR tools only need to be aware of the blocks that are in the RM. The static blocks can be ignored, allowing the "driver" model of Partial Reconfiguration of FIGS. 11-14 to be beneficial.

The NP/Programming Control Status Register (PCSR) structure is a group of registers that contain control bits (PCR) and status bits (PSR) that may be primarily used during the startup or shutdown sequencing of a function block. It should be noted that control and status registers are included in the function blocks, which may receive their programming bits or signals from the NPI bus and perform functions similar to the Global Signals which are used in the Fabric and programmable logic (PL) parts of the integrated circuit devices using CFI programming. In the simplest case, a block may require only some of these control signals. Other blocks may require many control signals. There may also be a Mask register to allow individual control bit writes. The control bits are similar to the Global Signals and are used to ensure that a block behaves correctly while being programmed and can be brought into or out of user operation in a seamless manner.

PCSRs may define the granularity of Partial Reconfiguration. That is, a PCSR may be similar to Global Signal Control (GSC), but for NPI programmed blocks, where the structure controlled by a PCSR is independently reconfigurable. According to some implementations, a block may not disturb any interface to which it is attached until transitioned into user operation. A block may avoid internal contention, oscillation, or enter a high-current state during the programming process. Inputs to a block may toggle randomly during programming and appropriate gating may be used in order to avoid negative block behavior that might result. A block may allow initialization, either to a hardwired reset state or to a programming dependent state, under the control of the programming source. After initialization the block state may remain unaffected by the behavior of inputs other than the programming control inputs. Blocks that drive signals off-chip may tristate all output drivers or, in the case of data transceivers, may drive a neutral signal.

Figure 15:
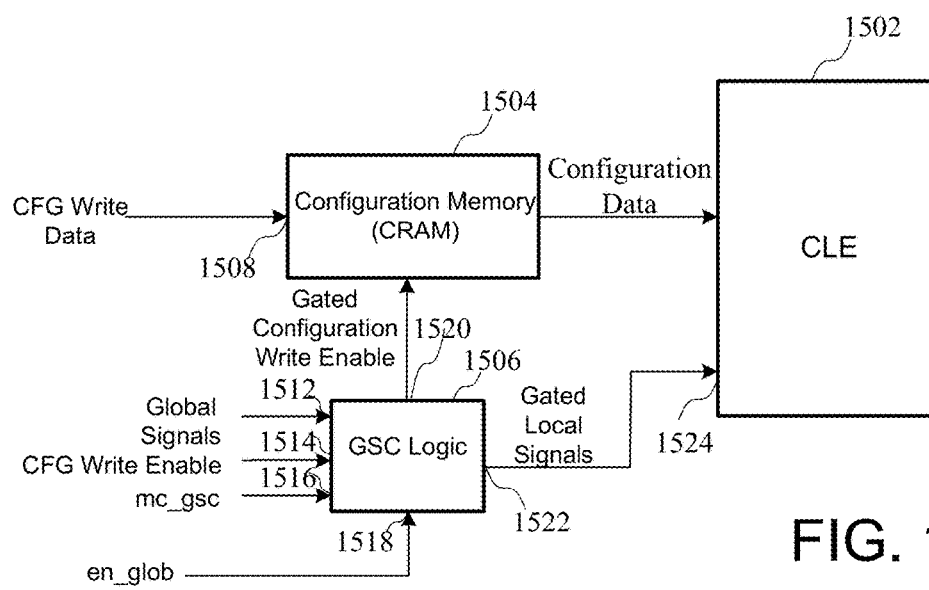
FIG. 15 is a block diagram of a portion of a circuit for configuring an integrated circuit using global control signals according to an example.

FIG. 15 is a block diagram of a portion of a circuit for configuring an integrated circuit using global control signals according to an example, such as by using a CFI bus as described above. The CLB of FIG. 15 comprises a CLE 1502, configuration memory (CRAM) 1504 and gating logic 1506. The circuit could comprise the gating logic 1506, where a local enable signal, such as mc_gsc, could control the operation of the gating logic circuit 1506. Similarly, the configuration memory elements associated with the programmable resources 1522 comprise the configuration memory 1504. Accordingly, the circuit of FIG. 15 both providing gated local signals to the CLE to control the operation of the CLE, as well as a gated configuration write enable signal which enables the ability to write to the configuration memory of the CLE, such as a LUT memory. The configuration memory receives configuration (CFG) write data to be written to the configuration memory in response to the gated configuration write enable signal. The configuration data stored in the configuration memory 1504 enables the operation of the CLE, as will be described in more detail below in reference to FIG. 16.

The gating logic 1506 is coupled to receive the global signals at an input 1512, a configuration write enable signal at an input 1514, and the local enable signal mc_gsc at an input 1516. It should be noted that the local enable signal mc_gsc could be a memory bit stored in the configuration memory, as set forth above. The gating logic 1506 also receives a global enable (en_glob) signal at an input 1518. Gated local signals generated at an output 1522 are coupled to an input 1524. Therefore, the global enable signal allows the local enable (mc_gsc) to be ignored, and all of the programmable resources to be reconfigured during a full reconfiguration. The local enable signal allows some configuration memory elements to be reconfigured based upon configuration write data provided during a partial reconfiguration, where a gated reconfiguration write enable signal associated with certain configuration memory cells, such as the configuration memory cells associated with a CLB for example, is generated in response to the local enable signal provided to that CLB.

The GSC bits and logic have the function of selectively "masking" the effects of these Global Signals for functional blocks which are intended to continue functioning during a partial reconfiguration (PR) event. An additional global enable signal (EN_GLOB) allows override of the state of the GSC bits. This signal is asserted during initial configuration in order to allow the Global Signals to be in effect throughout the entire device. The global enable signal and the local enable signal determine whether or not a configurable block will respond to a shutdown sequence, which is a sequence of changes in the logical states of the global signals. While particular global signals are described, it should be understood that different or additional global signals could be implemented, where a particular global signal may be specific to a particular type of circuit block. While the different or additional global signal would be routed to each circuit block of the particular type of circuit block, local reconfiguration signals associated with the different or additional global signal based upon a local enable signal.

Figure 16:
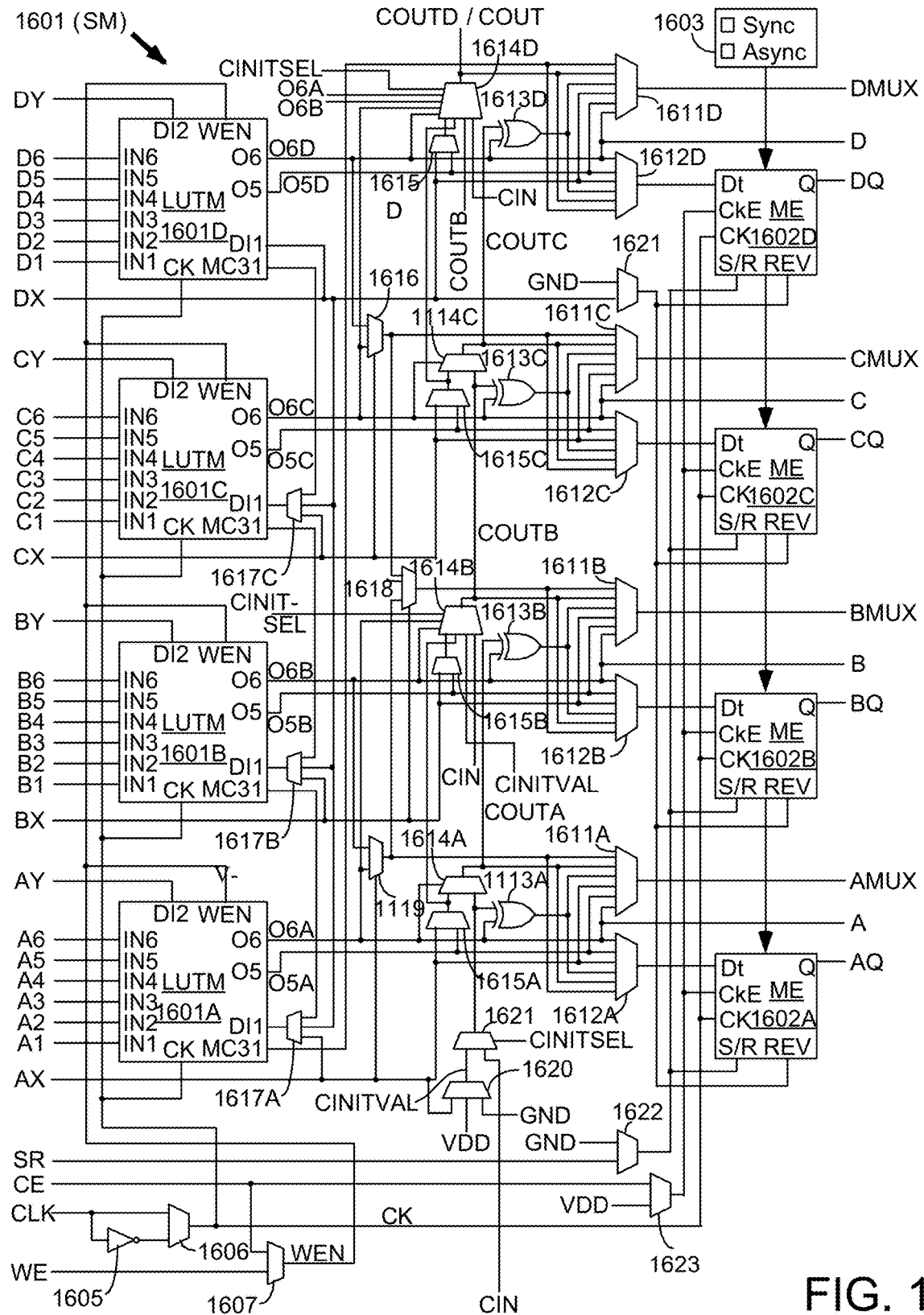
FIG. 16 is block diagram of a configurable logic element that could be implemented in FIG. 15 according to an example.

FIG. 16 is block diagram of a configurable logic element that could be implemented in an integrated circuit device, such as the CLE 1502 of FIG. 15 according to an example. In particular, FIG. 16 illustrates in simplified form a configurable logic element, which is an example of Programmable Logic, of a configuration logic block 1502 of FIG. 15. In the implementation of FIG. 16, slice M 1601 includes four lookup tables (LUTMs) 1601A-1601D, each driven by six LUT data input terminals A1-A6, B1-B6, C1-C6, and D1-D6 and each providing two LUT output signals O5 and O6. The O6 output terminals from LUTs 1601A-1601D drive slice output terminals A-D, respectively. The LUT data input signals are supplied by the FPGA interconnect structure via input multiplexers, which may be implemented by programmable interconnect element 1611, and the LUT output signals are also supplied to the interconnect structure. Slice M also includes: output select multiplexers 1611A-1611D driving output terminals AMUX-DMUX; multiplexers 1612A-1612D driving the data input terminals of memory elements 1602A-1602D; combinational multiplexers 1616, 1618, and 1619; bounce multiplexer circuits 1622-1623; a circuit represented by inverter 1605 and multiplexer 1606 (which together provide an optional inversion on the input clock path); and carry logic having multiplexers 1614A-1614D, 1615A-1615D, 1620-1621 and exclusive OR gates 1613A-1613D. All of these elements are coupled together as shown in FIG. 16. Where select inputs are not shown for the multiplexers illustrated in FIG. 16, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 15 for clarity, as well as from other selected figures herein.

In the pictured implementation, each memory element 1602A-1602D may be programmed to function as a synchronous or asynchronous flip-flop or latch. The selection between synchronous and asynchronous functionality is made for all four memory elements in a slice by programming Sync/Asynch selection circuit 1603. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1602A-1602D are clocked by a clock signal CK, which may be provided by a global clock network or by the interconnect structure, for example. Such programmable memory elements are well known in the art of FPGA design. Each memory element 1602A-1602D provides a registered output signal AQ-DQ to the interconnect structure. Because each LUT 1601A-1601D provides two output signals, O5 and O6, the LUT may be configured to function as two 5-input LUTs with five shared input signals (IN1-IN5), or as one 6-input LUT having input signals IN1-IN6.

In the implementation of FIG. 16, each LUTM 1601A-1601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1617A-1617C for LUTs 1601A-1601C), or to the two 32-bit RAMs via input terminals DI1 and DI2. RAM write operations in the LUT RAMs are controlled by clock signal CK from multiplexer 1506 and by write enable signal WEN from multiplexer 1507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1601A may also be provided to the general interconnect structure for shift register chaining, via output select multiplexer 1611D and CLE output terminal DMUX. Accordingly, the circuits and methods set forth above may be implemented in a device such as the device of FIG. 15, or any other suitable device.

Figure 17:
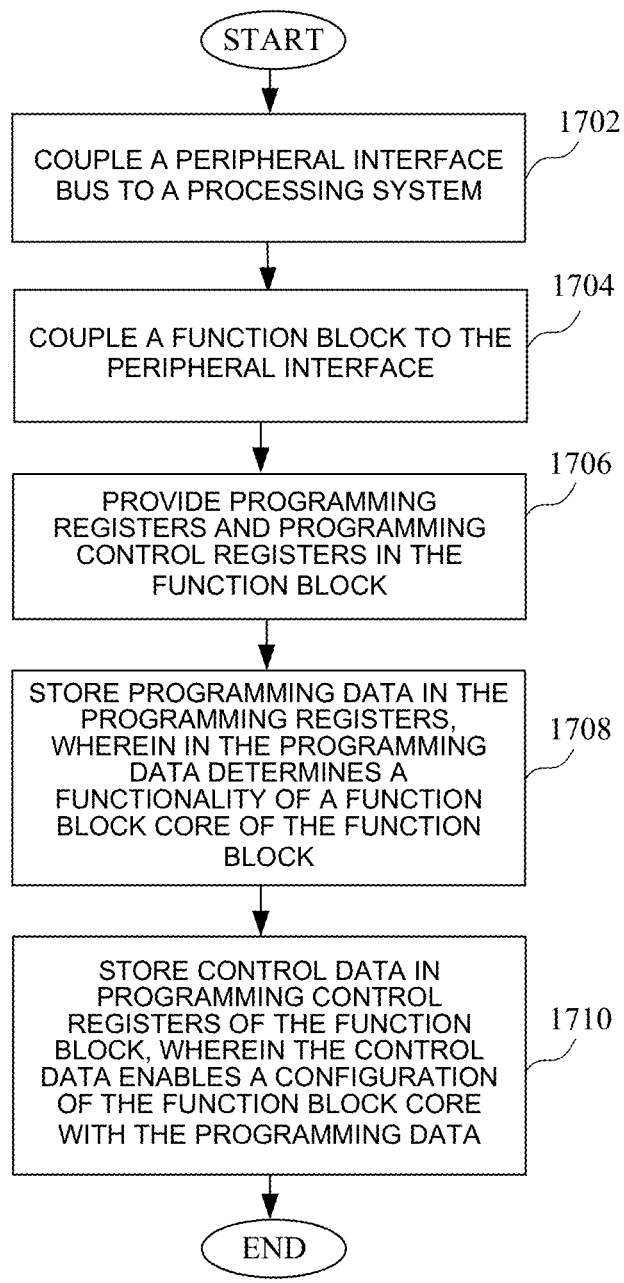
FIG. 17 is a flow chart showing a method of configuring function blocks of an integrated circuit device according to an example.

FIG. 17 is a flow chart showing a method of configuring function blocks of an integrated circuit device according to an example. A peripheral interface bus, such as an NPI bus as described above, is coupled to a processing system at a block 1702. A function block, such as a function block as described in FIG. 11-14, is coupled to the peripheral interface at a block 1704. Programming registers and programming control registers, such as the programming registers and control registers as described in FIG. 14, are provided in the function block at a block 1706. Programming data is stored in the programming registers, wherein in the programming data determines a functionality of a function block core of the function block at a block 1708. Control data is stored in programming control registers of the function block, wherein the control data enables a configuration of the function block core with the programming data at a block 1710.

The method may further comprise coupling an endpoint protocol block between the peripheral interface bus and the function block, where the endpoint protocol block transfers a transaction request for the function block into a format implemented by the function block. The method may also comprise enabling, by the processing system, a partial reconfiguration of the function block, wherein signals comprising control and status bits that are used during a startup or shutdown sequence of the function block storing may be stored in programming control registers.

The method may find particular application in a memory controller, wherein the function block comprises a memory controller having a first set of programming registers. Physical interface blocks may be coupled to the peripheral interface bus, wherein the physical interface blocks comprise a second set of programming registers. Input/output blocks may be coupled to the peripheral interface bus, wherein the input/output blocks comprise a third set of programming registers. The method may also find particular application in a data interface controller, wherein the function block may comprise a data interface controller having a first set of programming registers. Routing blocks may be coupled to the peripheral interface bus, wherein the routing blocks comprise a second set of programming registers. TX/RX blocks may also be coupled to the peripheral interface bus, wherein the TX/RX blocks comprise a third set of programming registers.

While the foregoing is directed to specific examples, other and further examples may be devised without departing from the basic scope thereof, and the scope thereof is determined by the claims that follow.

What is claimed is:

1. A circuit for configuring function blocks of an integrated circuit device, the circuit comprising:
   a processing system;
   a peripheral interface bus coupled to the processing system;
   input/output blocks coupled to the peripheral interface bus, the input/output blocks comprising a first set of programming control registers, and
   a function block coupled to the peripheral interface bus, the function block having programming registers and a function block core;
   wherein the programming registers store data determining a functionality of the function block core and comprise a second set of programming control registers enabling a configuration of the function block core using the data.

2. The circuit of claim 1 further comprising an endpoint protocol block coupled between the peripheral interface bus and the function block, where the endpoint protocol block transfers a transaction request for the function block into a format implemented by the function block.

3. The circuit of claim 1 wherein the processing system enables a partial reconfiguration of the function block.

4. The circuit of claim 3 wherein the programming control registers store signals comprising control and status bits that are used during a startup or shutdown sequence of the function block.

5. The circuit of claim 1 wherein the function block comprises a memory controller having a third set of programming control registers.

6. The circuit of claim 5 further comprising physical interface blocks coupled to the peripheral interface bus, wherein the physical interface blocks comprise a fourth set of programming control registers.

7. The circuit of claim 1 wherein the function block comprises a data interface controller having a third set of programming control registers.

8. The circuit of claim 7 further comprising routing blocks coupled to the peripheral interface bus, wherein the routing blocks comprise a fourth set of programming control registers.

9. The circuit of claim 8 further comprising TX/RX blocks coupled to the peripheral interface bus, wherein the TX/RX blocks comprise a fifth set of programming control registers.

10. A method of configuring function blocks of an integrated circuit device, the method comprising:
coupling a peripheral interface bus to a processing system;
coupling a function block to the peripheral interface bus,
coupling input/output blocks to the peripheral interface bus, wherein the input/output blocks comprise a first set of programming control registers;
providing programming registers and a second set of programming control registers in the function block;
storing programming data in the programming registers, wherein in the programming data determines a functionality of a function block core of the function block; and
storing control data in programming control registers of the function block, wherein the control data enables a configuration of the function block core with the programming data.

11. The method of claim 10 further comprising coupling an endpoint protocol block between the peripheral interface bus and the function block, where the endpoint protocol block transfers a transaction request for the function block into a format implemented by the function block.

12. The method of claim 10 further comprising enabling, by the processing system, a partial reconfiguration of the function block, wherein the control data comprises a standard group of control data.

13. The method of claim 12 further comprising storing, in programming control registers, signals comprising control and status bits that are used during a startup or shutdown sequence of the function block.

14. The method of claim 10 wherein the function block comprises a memory controller having a third set of programming control registers.

15. The method of claim 14 further comprising coupling physical interface blocks to the peripheral interface bus, wherein the physical interface blocks comprise a fourth set of programming control registers.

16. The method of claim 10 wherein the function block comprises a data interface controller having a third set of programming control registers.

17. The method of claim 16 further comprising coupling routing blocks to the peripheral interface bus, wherein the routing blocks comprise a fourth set of programming control registers.

18. The method of claim 17 further comprising coupling TX/RX blocks to the physical interface bus, wherein the TX/RX blocks comprise a fifth set of programming control registers.

* * * * *